United States Patent
Das et al.

(10) Patent No.: US 9,640,617 B2
(45) Date of Patent: May 2, 2017

(54) HIGH PERFORMANCE POWER MODULE

(71) Applicant: Cree, Inc., Durham, NC (US)

(72) Inventors: Mrinal K. Das, Durham, NC (US);
Robert J. Callanan, Raleigh, NC (US);
Henry Lin, Chapel Hill, NC (US);
John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/893,998

(22) Filed: May 14, 2013

(65) Prior Publication Data

US 2013/0248883 A1    Sep. 26, 2013

Related U.S. Application Data

(63) Continuation-in-part of application No. 13/588,329, filed on Aug. 17, 2012.

(Continued)

(51) Int. Cl.
*H01L 29/16* (2006.01)
*H01L 27/06* (2006.01)
(Continued)

(52) U.S. Cl.
CPC ........ *H01L 29/1608* (2013.01); *H01L 21/046* (2013.01); *H01L 21/049* (2013.01); *H01L 25/18* (2013.01); *H01L 27/0629* (2013.01); *H01L 29/0696* (2013.01); *H01L 29/7395* (2013.01); *H01L 29/7802* (2013.01); *H05K 7/1432* (2013.01); *H01L 24/48* (2013.01); *H01L 24/49* (2013.01); *H01L 25/072* (2013.01);
(Continued)

(58) Field of Classification Search
CPC .................. H01L 29/1608; H01L 27/0629
USPC .................................................. 257/77, 288
See application file for complete search history.

(56) References Cited

U.S. PATENT DOCUMENTS 3,439,189 A    4/1969    Petry
3,629,011 A    12/1971   Tohi et al.
(Continued)

FOREIGN PATENT DOCUMENTS

DE    3942640 A1    8/1990
DE    19809554 A1   9/1998
(Continued)

OTHER PUBLICATIONS

Trans Tech Publications, Switzerlands, 2009.*
(Continued)

*Primary Examiner* — Bilkis Jahan
(74) *Attorney, Agent, or Firm* — Anthony J. Josephson

(57) ABSTRACT

The present disclosure relates to a power module that has a housing with an interior chamber and a plurality of switch modules interconnected to facilitate switching power to a load. Each of the plurality of switch modules comprises at least one transistor and at least one diode mounted within the interior chamber and both the at least one transistor and the at least one diode are majority carrier devices, are formed of a wide bandgap material system, or both. The switching modules may be arranged in virtually any fashion depending on the application. For example, the switching modules may be arranged in a six-pack, full H-bridge, half H-bridge, single switch or the like.

48 Claims, 22 Drawing Sheets

Related U.S. Application Data

(60) Provisional application No. 61/533,254, filed on Sep. 11, 2011.

(51) Int. Cl.
    *H01L 21/04* (2006.01)
    *H01L 29/739* (2006.01)
    *H01L 29/78* (2006.01)
    *H01L 29/06* (2006.01)
    *H01L 25/18* (2006.01)
    *H05K 7/14* (2006.01)
    *H01L 29/66* (2006.01)
    *H01L 29/04* (2006.01)
    *H02M 7/00* (2006.01)
    *H02M 7/5387* (2007.01)
    *H01L 23/00* (2006.01)
    *H01L 25/07* (2006.01)
    *H02P 7/03* (2016.01)

(52) U.S. Cl.
    CPC ...... *H01L 29/045* (2013.01); *H01L 29/66068* (2013.01); *H01L 2224/0603* (2013.01); *H01L 2224/48137* (2013.01); *H01L 2224/48139* (2013.01); *H01L 2224/48227* (2013.01); *H01L 2224/4903* (2013.01); *H01L 2224/49111* (2013.01); *H01L 2224/49175* (2013.01); *H01L 2924/00014* (2013.01); *H01L 2924/12032* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/15153* (2013.01); *H01L 2924/19105* (2013.01); *H01L 2924/19107* (2013.01); *H01L 2924/30107* (2013.01); *H02M 7/003* (2013.01); *H02M 7/5387* (2013.01); *H02P 7/04* (2016.02)

(56) References Cited

U.S. PATENT DOCUMENTS

| | | |
|---|---|---|
| 3,924,024 A | 12/1975 | Naber et al. |
| 4,160,920 A | 7/1979 | Courier de Mere |
| 4,242,690 A | 12/1980 | Temple |
| 4,466,172 A | 8/1984 | Batra |
| 4,581,542 A | 4/1986 | Steigerald |
| 4,644,637 A | 2/1987 | Temple et al. |
| 4,811,065 A | 3/1989 | Cogan |
| 4,875,083 A | 10/1989 | Palmour |
| 4,927,772 A | 5/1990 | Arthur et al. |
| 4,945,394 A | 7/1990 | Palmour et al. |
| 4,946,547 A | 8/1990 | Palmour et al. |
| 5,005,462 A | 4/1991 | Jasper, Jr. et al. |
| 5,011,549 A | 4/1991 | Kong et al. |
| 5,028,977 A | 7/1991 | K. O. Kenneth et al. |
| 5,032,888 A | 7/1991 | Seki |
| 5,111,253 A | 5/1992 | Korman et al. |
| 5,155,289 A | 10/1992 | Bowles et al. |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,459,107 A | 10/1995 | Palmour et al. |
| 5,468,654 A | 11/1995 | Harada et al. |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal et al. |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour et al. |
| 5,703,383 A | 12/1997 | Nakayama |
| 5,710,059 A | 1/1998 | Rottner et al. |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris et al. |
| 5,776,837 A | 7/1998 | Palmour et al. |
| 5,804,483 A | 9/1998 | Harris et al. |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller et al. |
| 5,877,045 A | 3/1999 | Kapoor et al. |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh et al. |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa et al. |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno et al. |
| 6,054,728 A | 4/2000 | Harada et al. |
| 6,063,698 A | 5/2000 | Tseng et al. |
| 6,083,814 A | 7/2000 | Nilsson et al. |
| 6,091,108 A | 7/2000 | Harris et al. |
| 6,096,607 A | 8/2000 | Ueno et al. |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno et al. |
| 6,121,633 A | 9/2000 | Singh et al. |
| 6,133,587 A | 10/2000 | Takeuchi et al. |
| 6,136,727 A | 10/2000 | Ueno et al. |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,252,258 B1 | 6/2001 | Chang et al. |
| 6,252,288 B1 | 6/2001 | Chang |
| 6,297,100 B1 | 10/2001 | Kumar et al. |
| 6,297,172 B1 | 10/2001 | Kashiwagi |
| 6,303,508 B1 | 10/2001 | Alok |
| 6,310,775 B1 | 10/2001 | Nagatomo et al. |
| 6,316,791 B1 | 11/2001 | Schörner et al. |

(56) References Cited

U.S. PATENT DOCUMENTS

| | | |
|---|---|---|
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,344,676 B1 | 2/2002 | Yun et al. |
| 6,365,462 B2 | 4/2002 | Baliga |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,534,367 B2 | 3/2003 | Peake et al. |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,974,720 B2 | 12/2005 | Sumakeris et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,221,010 B2 | 5/2007 | Ryu |
| 7,230,275 B2 | 6/2007 | Kumar et al. |
| 7,253,031 B2 | 8/2007 | Takahashi et al. |
| 7,276,747 B2 | 10/2007 | Loechelt et al. |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,407,837 B2 | 8/2008 | Tsuji |
| 7,425,757 B2 | 9/2008 | Takubo |
| 7,498,633 B2 | 3/2009 | Cooper et al. |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 7,829,402 B2 | 11/2010 | Matocha et al. |
| 7,855,384 B2 | 12/2010 | Yamamoto et al. |
| 7,855,464 B2 | 12/2010 | Shikano |
| 8,035,112 B1 | 10/2011 | Cooper et al. |
| 8,541,787 B2 | 9/2013 | Zhang |
| 9,029,945 B2 | 5/2015 | Ryu et al. |
| 9,142,662 B2 | 9/2015 | Ryu et al. |
| 2001/0011729 A1 | 8/2001 | Singh et al. |
| 2001/0033502 A1 | 10/2001 | Blair et al. |
| 2001/0050383 A1 | 12/2001 | Hatade et al. |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0071293 A1* | 6/2002 | Eden .............. H01L 23/4824 363/20 |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2002/0185679 A1 | 12/2002 | Baliga |
| 2003/0025175 A1 | 2/2003 | Asano et al. |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0041229 A1 | 3/2004 | Chol et al. |
| 2004/0082116 A1 | 4/2004 | Kub et al. |
| 2004/0183079 A1 | 9/2004 | Kaneko et al. |
| 2004/0207968 A1 | 10/2004 | Martin et al. |
| 2004/0211980 A1 | 10/2004 | Ryu |
| 2004/0212011 A1 | 10/2004 | Ryu |
| 2004/0227231 A1* | 11/2004 | Maly et al. ............ 257/724 |
| 2004/0256659 A1 | 12/2004 | Kim et al. |
| 2004/0259339 A1 | 12/2004 | Tanabe et al. |
| 2005/0012143 A1 | 1/2005 | Tanaka et al. |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0152100 A1 | 7/2005 | Rodriguez et al. |
| 2005/0181536 A1 | 8/2005 | Tsuji |
| 2005/0230686 A1 | 10/2005 | Kojima et al. |
| 2005/0275055 A1 | 12/2005 | Parthasarathy et al. |
| 2006/0011128 A1 | 1/2006 | Ellison et al. |
| 2006/0055027 A1 | 3/2006 | Kitabatake et al. |
| 2006/0060884 A1 | 3/2006 | Ohyanagi et al. |
| 2006/0071295 A1 | 4/2006 | Chang |
| 2006/0086997 A1 | 4/2006 | Kanaya et al. |
| 2006/0108589 A1 | 5/2006 | Fukuda et al. |
| 2006/0211210 A1 | 9/2006 | Bhat et al. |
| 2006/0216896 A1 | 9/2006 | Saito et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2006/0270103 A1 | 11/2006 | Das et al. |
| 2007/0066039 A1 | 3/2007 | Agarwal et al. |
| 2007/0090415 A1* | 4/2007 | Ronsisvalle .............. 257/288 |
| 2007/0096081 A1* | 5/2007 | Sugawara ................ 257/40 |
| 2007/0114606 A1 | 5/2007 | Hoshino et al. |
| 2007/0120148 A1 | 5/2007 | Nogome |
| 2007/0164321 A1 | 7/2007 | Sheppard et al. |
| 2007/0241427 A1 | 10/2007 | Mochizuki et al. |
| 2007/0262324 A1 | 11/2007 | Kaneko |
| 2008/0001158 A1 | 1/2008 | Das et al. |
| 2008/0006848 A1 | 1/2008 | Chen et al. |
| 2008/0029838 A1 | 2/2008 | Zhang et al. |
| 2008/0048258 A1 | 2/2008 | de Fresart et al. |
| 2008/0105949 A1 | 5/2008 | Zhang et al. |
| 2008/0191304 A1 | 8/2008 | Zhang et al. |
| 2008/0224316 A1 | 9/2008 | Kroeninger et al. |
| 2008/0230787 A1 | 9/2008 | Suzuki et al. |
| 2008/0251793 A1 | 10/2008 | Mazzola et al. |
| 2008/0258252 A1 | 10/2008 | Shimizu et al. |
| 2008/0277669 A1 | 11/2008 | Okuno et al. |
| 2008/0296771 A1 | 12/2008 | Das et al. |
| 2009/0008709 A1 | 1/2009 | Yedinak et al. |
| 2009/0039498 A1 | 2/2009 | Bayerer |
| 2009/0095979 A1 | 4/2009 | Saito et al. |
| 2009/0101918 A1 | 4/2009 | Uchida et al. |
| 2009/0121319 A1 | 5/2009 | Zhang et al. |
| 2009/0146154 A1 | 6/2009 | Zhang et al. |
| 2009/0168471 A1* | 7/2009 | Tsugawa et al. .......... 363/56.01 |
| 2009/0212301 A1 | 8/2009 | Zhang et al. |
| 2009/0225578 A1* | 9/2009 | Kitabatake .......... H01L 29/0696 363/132 |
| 2009/0272982 A1 | 11/2009 | Nakamura et al. |
| 2009/0289262 A1 | 11/2009 | Zhang et al. |
| 2009/0321746 A1 | 12/2009 | Harada et al. |
| 2010/0032685 A1 | 2/2010 | Zhang et al. |
| 2010/0133549 A1 | 6/2010 | Zhang et al. |
| 2010/0133550 A1 | 6/2010 | Zhang et al. |
| 2010/0140628 A1 | 6/2010 | Zhang |
| 2010/0163888 A1 | 7/2010 | Saggio et al. |
| 2010/0244047 A1 | 9/2010 | Hull et al. |
| 2010/0295062 A1 | 11/2010 | Uchida et al. |

(56) References Cited

U.S. PATENT DOCUMENTS

| | | | |
|---|---|---|---|
| 2011/0012132 A1 | 1/2011 | Otsuka et al. | |
| 2011/0018004 A1 | 1/2011 | Shimizu et al. | |
| 2011/0018040 A1 | 1/2011 | Smith et al. | |
| 2011/0058293 A1* | 3/2011 | Pardoen | H01L 27/0251 361/56 |
| 2011/0101375 A1 | 5/2011 | Zhang | |
| 2011/0193412 A1 | 8/2011 | Lacarnoy | |
| 2011/0199792 A1 | 8/2011 | Friebe et al. | |
| 2011/0246794 A1 | 10/2011 | Liao | |
| 2011/0292617 A1 | 12/2011 | Darroman et al. | |
| 2012/0025263 A1 | 2/2012 | Yamaguchi | |
| 2012/0044720 A1 | 2/2012 | Shea et al. | |
| 2013/0000170 A1 | 1/2013 | Dueck et al. | |
| 2013/0248883 A1 | 9/2013 | Das et al. | |
| 2013/0307500 A1 | 11/2013 | Nojiri et al. | |

FOREIGN PATENT DOCUMENTS

| | | |
|---|---|---|
| DE | 19832329 A1 | 2/1999 |
| DE | 19900171 A1 | 7/1999 |
| DE | 10036208 A1 | 2/2002 |
| EP | 0176778 A2 | 4/1986 |
| EP | 0372412 A1 | 6/1990 |
| EP | 0389863 A1 | 10/1990 |
| EP | 0637069 A1 | 2/1995 |
| EP | 0837508 A2 | 4/1996 |
| EP | 0735591 A1 | 10/1996 |
| EP | 0865085 A1 | 9/1998 |
| EP | 1058317 A2 | 12/2000 |
| EP | 1361614 A1 | 11/2003 |
| EP | 1460681 A2 | 9/2004 |
| EP | 1503425 A2 | 2/2005 |
| EP | 1693896 A1 | 8/2006 |
| EP | 1806787 A1 | 7/2007 |
| EP | 1845561 A2 | 10/2007 |
| EP | 2015364 A2 | 1/2009 |
| EP | 2124257 A1 | 11/2009 |
| EP | 2432014 A1 | 3/2012 |
| JP | 60240158 A | 11/1985 |
| JP | 1117363 A | 5/1989 |
| JP | 03034466 A | 2/1991 |
| JP | 03157974 A | 7/1991 |
| JP | 3225870 A | 10/1991 |
| JP | 08264766 A | 10/1996 |
| JP | H08340103 A | 12/1996 |
| JP | 09205202 A | 8/1997 |
| JP | 11191559 A | 7/1999 |
| JP | 11238742 A | 8/1999 |
| JP | 11261061 A | 9/1999 |
| JP | 11266017 A | 9/1999 |
| JP | 11274487 A | 10/1999 |
| JP | 2000049167 A | 2/2000 |
| JP | 2000082812 A | 3/2000 |
| JP | 2000106371 A | 4/2000 |
| JP | 2000252461 A | 9/2000 |
| JP | 2000252478 A | 9/2000 |
| JP | 2002314099 A | 10/2002 |
| JP | 2004363328 A | 12/2004 |
| JP | 2007258742 A | 10/2007 |
| JP | 2008277400 A | 11/2008 |
| JP | 2010010505 A | 1/2010 |
| JP | 2010183840 A | 8/2010 |
| JP | 2011030424 A | 2/2011 |
| JP | 2012156548 A | 8/2012 |
| WO | 9603774 A1 | 2/1996 |
| WO | 9708754 A2 | 3/1997 |
| WO | 9717730 A1 | 5/1997 |
| WO | 9739485 A1 | 10/1997 |
| WO | 9802916 A1 | 1/1998 |
| WO | 9802924 A2 | 1/1998 |
| WO | 9808259 A1 | 2/1998 |
| WO | 9832178 A1 | 7/1998 |
| WO | 9963591 A1 | 12/1999 |
| WO | 0013236 A2 | 3/2000 |
| WO | 0178134 A1 | 10/2001 |
| WO | 2004020706 A1 | 3/2004 |
| WO | 2004079789 A2 | 9/2004 |
| WO | 2005020308 A1 | 3/2005 |
| WO | 2006135031 A2 | 12/2006 |
| WO | 2007040710 A1 | 4/2007 |
| WO | 2009128382 A1 | 10/2009 |
| WO | 2010004715 A1 | 1/2010 |
| WO | 2010074275 A1 | 7/2010 |
| WO | 2013036370 A1 | 3/2013 |

OTHER PUBLICATIONS

Non-Final Office Action for U.S. Appl. No. 13/588,329, mailed Sep. 24, 2014, 16 pages.
Afanasev, V. et al., "Intrinsic SiC/SiO2 Interface States", Phys. Stat. Sol., Jan. 31, 1997, vol. 162, pp. 321-337.
Agarwal et al., "9kV, 1xcm SiC Super GTO Technology Development for Pulse Power," Pulsed Power Conference, 2009, presented Jun. 28-Jul. 2, 2009, pp. 264-269.
Agarwal, A.K. et al., "700-V Assymetrical 4H-SiC Gate Turn-Off Thyristors (GTO's)," IEEE Electron Device Letters, vol. 18, No. 11, Nov. 1997, pp. 518-520.
Agarwal, A.K. et al., "1.1 kV 4H-SiC Power UMOSFETs", IEEE Electron Devices Letters, Dec. 1997, vol. 18, No. 12, pp. 586-588.
Agarwal, A.K. et al., "1400 V 4H-SiC Power MOSFETs", Materials Science Forum, Jan. 1998, vols. 264-268, pp. 989-992.
Agarwal, A.K. et al., "A Critical Look at the Performance Advantages and Limitations of 4H-SiC Power UMOSFET Structures", Proceedings of the International Symposium on Power Semiconductor Devices and IC's, May 20-23, 1996, pp. 119-122.
Agarwal, A.K. et al., "Investigation of Lateral RESURF, 6H-SiC MOSFETs", Materials Science Forum, Copyright: 2000, vols. 338-342, pp. 1307-1310.
Agarwal, A.K. et al., "Temperature Dependence of Fowler-Nordheim Current in 6H- and 4H—SiC MOS Capacitors", IEEE Electron Device Letters, Dec. 1997, vol. 18, No. 12, pp. 592-594.
Alok, Dev. et al., "Process Dependence of Inversion Layer Mobility in 4H—SiC Devices", Silicon Carbide and Related Materials, Oct. 10-15, 1999, pp. 1077-1080.
Asano, K. et al., "Dynamic Characteristics of 6.2 kV High Voltage 4H—SiC pn Diode with Low Loss", Transactions of the Institute of Electrical Engineers of Japan, May 2003, vol. 123-D, No. 5, pp. 623-627.
Author Unknown, "Definition of Overlap," The American Heritage Dictionary of the English Language, Fourth Edition, Sep. 2003, 3 pages, http://www.thefreedictionary.com/overlap.
Author Unknown, "Insulated-Gate Bipolar Transistor," Wikipedia—The Free Encyclopedia, Jun. 21, 2010, 6 pages, http://en.wikipedia.org/wiki/Insulated-gate_bipolar_transistor.
Author Unknown, "Motorola Power MOSFET Transistor Databook", 4th Edition, Motorola, Inc., Copyright: 1989, pp. 254-257.
Author Unknown, "The Insulated Gate Biopolar Transistor (IGBT)", University of Glasgow, Updated: Feb. 14, 2007, Retrieved Jul. 7, 2006, http://www.elec.gla.ac.uk/groups/dev_mod/papers/igbt/igbt.html.
Ayalew, T., "4.4.3.1 MPS Diode Structure", Tu Wien, Jul. 6, 2006, http://www.iue.tuwien.ac.at/phd/ayalew/node88.html.
Baliga, B., "Chapter 7: Power Mosfet", Power Semiconductor Devices, May 2, 1995, pp. 335-425, Boston, MA, PWS Publishing Company.
Baliga, B., "Chapter 8: Insulated Gate Bipolar Transistor", Power Semiconductor Devices, May 2, 1995, pp. 426-502, Boston, MA, PWS Publishing Company.
Bhatnagar et al., "Comparison of 6H—SiC, 3C—SiC, and Si for power devices," Transactions on Electron Devices, vol. 40, No. 3, Mar. 1993, pp. 645-655.
Buchner, R. et al., "Laser Recrystallization of Polysilicon for Improved Device Quality", Springer Proceedings in Physics, Copyright: 1989, vol. 55, pp. 289-294.

(56) References Cited

OTHER PUBLICATIONS

Capano, M.A. et al., "Ionization Energies and Electron Mobilities in Phosphorus- and Nitrogen-Implanted 4H Silicon Carbide", IEEE ICSCRM Conference 1999, Oct. 10-13, 1999, 4 pages.

Capano, M.A. et al., "Surface Roughening in Ion Implanted 4-H Silicon Carbide", Journal of Electronic Materials, Jul. 20, 1998, vol. 28, No. 3, pp. 214-218.

Casady, J.B. et al., "900 V DMOS and 1100 V UMOS 4H—SiC Power FETs", Northrop Grumman Science and Technology Center, Published: 1997, 2 Pages.

Chakraborty, Supratic et al., "Interface Properties of N2O-Annealed SiO2/SiC System", 2008 IEEE Proceedings of the Electron Devices Meeting, Dec. 15-17, 2000, pp. 108-111, Hong Kong.

Chang, H.R. et al., "500-V n-Channel Insulated-Gate Bipolar Transistor with a Trench Gate Structure," IEEE Transactions on Electron Devices, vol. 36, No. 9, Sep. 1989, pp. 1824-1829.

Chang, K.C. et al., "Observation of a Non-Stoichiometric Layer at the Silicon Dioxide—Silicon Carbide Interface: Effect of Oxidation Temperature and Post-Oxidation Processing Conditions", Materials Research Social Symposium Procedures, vol. 640, Nov. 29-Dec. 2, 2011, 6 pages.

Chen, Jia-Rong et al., "Theoretical Analysis of Current Crowding Effect in Metal/AlGaN/GaN Schottky Diodes and its Reduction by Using Polysilicon in Anode", Chinese Physics Letters, Jul. 2007, vol. 24, No. 7, pp. 2112-2114.

Cho, Won-Ju et al., "Improvement of Charge Trapping by Hydrogen Post-Oxidation Annealing in Gate Oxide of 4H—SiC metal-oxide-semiconductor capacitors", Applied Physical Letters, Aug. 21, 2000, vol. 77, No. 8, 1215-1217.

Chung, G.Y. et al., "The Effect of Si:C Source Ratio on S102 /SiC Interface State Density for Nitrogen Doped 4H and 6H SiC", Materials Science Forum, Copyright: 2000, vol. 338-342, pp. 1097-1100.

Chung, G.Y. et al., "Effect of Nitric Oxide Annealing on the Interface Trap Densities Near the Band Edges in the 4H Polytype Silicon Carbide", Applied Physics Letters, Mar. 27, 2000, vol. 76, No. 13, pp. 1713-1715.

Chung, G.Y. et al., "Improved Inversion Channel Mobility for 4h—SiC MOSFETs Following High Temperature Anneals in Nitric Oxide", IEEE Electron Device Letters, Apr. 2001, vol. 22, No. 4, pp. 176-178.

Chung, Gilyong et al., "Effects of Anneals in Ammonia on the Interface Trap Density Near the Band Edges in 4H—Silicon Carbide Metal-Oxide-Semiconductor Capacitors", Applied Physical Letters, Nov. 27, 2000, vol. 77, No. 22, pp. 3601-3603.

Dahlquist, F. et al., "A 2.8kV, Forward Drop JBS Diode with Low Leakage", Materials Science Forum, Jan. 2000, vols. 338-342, pp. 1179-1182.

Das, M.K. et al., "High Mobility 4H—SiC Inversion Mode MOSFETs Using Thermally Grown", No Annealed SiO2,, IEEE 58th Device Research Conference, Jun. 19-21, 2000, 3 Pages.

Das, M.K. et al., "Inversion Channel Mobility in 4H- and 6H—SiC MOSFETs", School of Electrical and Computer Engineering at Purdue University, Published: 1998, 2 pages.

Das, Mrinal K. et al., "A 13 kV 4H—SiC n-Channel IGBT with Low Rdiff on and Fast Switching", DARPA Contract, Sep. 2008, 4 Pages.

Das, Mrinal K., "Fundamental Studies of the Silicon Carbide MOS Structure", Thesis submitted to Purdue University for Doctorate of Philosophy Program, Dec. 1999, 160 Pages.

Dastidar, Sujoyita, "A Study of P-Type Activation in Silicon Carbide", Thesis submitted to Faculty of Purdue University, May 1998, 102 Pages.

De Meo, R.C. et al., "Thermal Oxidation of SiC in N2O", The Electrochemical Society, Inc., Nov. 1994, vol. 141, No. 11, pp. L150-L152.

Del Prado, A. et al., "Full Composition Range Silicon Oxynitride Films Deposited by ECR-PECVD at Room Temperature", Thin Solid Films, Apr. 1999, vols. 343-344, pp. 437-440.

Dimitrijev, Sima et al., "Nitridation of Silicon-Dioxide Films Grown on 6H Silicon Carbide", IEEE Electron Device Letters, May 1997, vol. 18, No. 5, pp. 175-177.

Fisher, C.A. et al., "The Performance of High-Voltage Field Relieved Schottky Barrier Diodes", IEE Proceedings, Dec. 1985, vol. 132, Pt. 1, No. 6, pp. 257-260.

Fukuda, Kenji et al., "Improvement of SiO2/4H—SiC Interface by Using High Temperature Hydrogen Annealing at 1000• C", External Abstracts of the 1998 International Conference on Solid State Devices and Materials, Published: 1998, pp. 100-101.

Fukuda, Kenji et al., "Improvement of SiO2/4H—SiC Interface Using High-Temperature Hydrogen Annealing at Low Pressure and Vacuum Annealing", Japanese Journal of Applied Physics, Apr. 1999, vol. 38, pp. 2306-2309.

Hubel, Kerstin, "Hybrid Design Improves Diode Robustness and Boosts Efficiency", Compound Semiconductor. Net, Updated: May 2006, Retrieved: Jul. 7, 2006, http://www.compoundsemiconductor.net.

Hull, Brett A. et al., "Drift-Free 10-kV, 20-A 4H—SiC PiN Diodes", Journal of Electronic Materials, Apr. 2005, vol. 34, No. 4, pp. 341-344.

Jamet, P. et al., "Physical Properties of N/sub 2/0 and No—Nitrided Fate Oxides Grown on 4H SiC", Applied Physics Letters, Jul. 2001, vol. 79, No. 3, pp. 323-325.

Kinoshita, Kozo et al., "Guard Ring Assisted Resurf: A New Termination Structure Providing Stable and High Breakdown Voltage for SiC Power Devices", Proceedings of the 14th International Symposium on Power Semiconductor Devices and ICs, Jun. 7, 2002, pp. 253-256.

Kobayashi, K. et al., "Dielectric Breakdown and Current Conduction of Oxide/Nitride/Oxide Multi-Layer Structures", 1990 Symposium of VLSI Technology, Jun. 4-7, 1990, pp. 119-120.

Krishnaswami, Sumi et al., "High Temperature Characterization of 4H—SiC Bipolar Junction Transistors", Materials Science Forum, Jan. 1, 2009, vols. 527-529, pp. 1437-1440.

Lai, P.T. et al., "Effects of Nitridation and Annealing on Interface Properties of Thermally Oxidized SIO2 /SiC Metal-Oxide-Semiconductor System", Applied Physics Letters, Jun. 19, 2000, vol. 75, No. 25, pp. 3744-3748.

Lai, P.T. et al., "Interface properties of N2O-Annealed NH3-Treated 6H—SiC MOS Capacitor", Proceedings of the IEEE Hong Kong Electron Devices Meeting, Jun. 26, 1999, pp. 46-49.

Leonhard et al. "Long Term Stability of Gate-Oxides on n- and P-Type Silicon Carbide Studied by Charge Injection Techniques," Materials Science Engineering, vol. 46, No. 1-3, Apr. 1997, pp. 263-266.

Levinshtein, Michael E. et al., "On the Homogeneity of the Turn-on Process in High-Voltage 4H—SiC Thyristors", Solid-State Electronics, Feb. 2005, vol. 49, pp. 233-237.

Li, H.F. et al., "Improving SiO2 Grown on P-Type 4H—SiC by NO Annealing", Materials Science Forum, Feb. 1998, vol. 264-268, pp. 869-872.

Li, Y. et al., "High-Voltage (3 kV) UMOSFETs in 4H—SiC", IEEE Transactions on Electron Devices, Jun. 2002, vol. 49, No. 6, pp. 972-975.

Lipkin, L.A. et al., "Low Interfaces State Density Oxides on P-Type SiC", Materials Science Forum, Jan. 1998, vols. 264-268, pp. 853-856.

Lipkin, Lori et al., "Challenges and State-of-the-Art of Oxides on SiC", Material Research Social Symposium Proceedings, Nov. 2000, vol. 640, pp. 89-98.

Lipkin, Lori et al., "Insulator Investigation on SiC for Improved Reliability", IEEE Transactions on Electron Devices, Mar. 1999, vol. 46, No. 3, pp. 525-532.

Losee, P.A. et al., "High-Voltage 4H—SiC PiN Rectifiers with Single-Implant, Multi-Zone JTE Termination", Proceedings for 2004 International Symposium on Power Semiconductor Devices & ICs, May 2004, pp. 301-304.

Losse, P.A. et al., "Degraded Blocking Performance of 4H—SiC Rectifiers Under High dV/dt Conditions", Proceedings for 17th International Symposium on Power Semiconductor Devices & ICs, May 23-26, 2005, pp. 1-4.

(56) References Cited

OTHER PUBLICATIONS

Ma, Y. et al., "Fixed and Trapped Charges at Oxide—Nitride—Oxide Heterostructure Interfaces Formed by Remote Plasma Enhanced Chemical Vapor Deposition", American Vacuum Society, Jul. 1993, vol. 11, No. 4, pp. 1533-1540.
Miura, Naruhisa et al., "Successful Development of 1.2 kV 4H—SiC MOSFETs with the Very Low on-Resistance of 5 mΩm2," Proceedings of the 18th International Symposium on Power Semiconductor Devices & IC's, Jun. 4-8, 2006, 4 pages, Naples Italy.
Mondal, K. et al., "An Integrated 500-V Power DMOSFET/Antiparallel Rectifier Device with Improved Diode Reverse Recovery Characteristics", IEEE Electron Device Letters, Sep. 2002, vol. 23, No. 9, pp. 562-564.
Mutin, P. Hubert, "Control of the Composition and Structure of Silicon Oxycarbide and Oxynitride Glasses Derived from Polysiloxane Precursors", Journal of Sol—Gel Science and Technology, Mar. 1999, pp. 27-38.
Myer-Ward, R.L. et al., "Turning of Basal Plane Dislocations During Epitaxial Growth on 4 Off-Axis 4h—SiC", 7th European Conference on Silicon Carbide and Related Materials, Sep. 7-11, 2008, retrieved Jul. 1, 2009, http://escrm08.com/invited_presentations.html, Barcelona, Spain.
Palmour, J.W. et al., "SiC Device Technology: Remaining Issues", Diamond and Related Materials, Aug. 1997, vol. 5, pp. 1400-1404.
Palmour, John, "Silicon Carbide npnp Thyristors", NASA Tech Briefs. Updated: Dec. 1, 2000, Retrieved Sep. 2, 2010, http://www.techbriefs.com/component/content/article/7031.
Pankin, D. et al., "Electrical and Microstructural Properties of Highly Boron-Implantation Doped 6H—SiC", Journal of Applied Physics, Mar. 15, 2001, vol. 89, No. 6, pp. 3162-3167.
Pantelides, S.T. et al., "Atomic-Scale Engineering of the SiC—SiO2 Interface", Materials Science Forum, Oct. 1999, vols. 338-342, pp. 1133-1136.
Patel, R. et al., "Phosphorus-Implanted High-Voltage N+P 4H—SiC Junction Rectifiers", Proceedings of 1998 International Symposium on Power Semiconductor Devices & Ics, Jun. 1998, pp. 387-390.
Rao et al., "Al and N Ion Implantations in 6H—SiC," Inst. Phys. Conf. Ser. No. 142, Chapter 3, Jan. 1996, pp. 521-524.
Rao, Mulpuri V. et al., "P—N Junction Formation in 6H—SiC Acceptor Implantation into a N-Type Substrate", Nuclear Instructions and Mechanics in Physics Res., Dec. 1995, vol. 106, pp. 333-338.
Rao, Mulpuri V., "Maturing Ion-Implantation Technology and its Device Applications in SiC", Solid State Electronics, Feb. 2003, vol. 47, pp. 213-222.
Rao, S. et al., "Silane Overpressure Post-Implant Annealing of Al Dopants in SiC: Cold Wall CVD Apparatus", Applied Surface Science, Mar. 2006, vol. 252, pp. 3837-3842.
Richmond, J.T. et al., "Hybrid 4H—SiC MOS Gated Transistor (MGT)", DARPA Contract #N00014-99-C-0377, Sep. 2002, 6 pages.
Ryu, Sei-Hyung et al., "27 mΩ-cm2, 1.6 kV Power DiMOSFETs in 4H—SiC", Proceedings of the 14th International Symposium on Power Semiconductor Devices & ICs 2002, ISPSD '02 Proceedings, Jun. 4-7, 2002, pp. 65-68, Santa Fe, NM.
Salem, T.E. et al., "High-Temperature High-Power Operation of a 100 A SiC DMOSFET Module," Twenty-Fourth Annual IEEE Applied Power Electronics Conference and Exposition, Feb. 2009, pp. 653-657.
Schörner, Reinhold et al., "Rugged Power MOSFETs in 6H—SiC with Blocking Capability up to 1800V", Silicon Carbide and Related Materials, Jan. 2000, vols. 338-342, pp. 1295-1298.
Schörner, Reinhold et al., "Significantly Improved Performance of MOSFET's on Silicon Carbide Using the 15R-SiC Polytype", IEEE Electron Device Letters, May 1999, vol. 20, No. 3, pp. 241-244.
Senzaki, Junji et al., "Effects of Pyrogenic Reoxidation Annealing on Inversion Channel Mobility of 4H—SiC Metal-Oxide-Semiconductor Field-effect Transistor Fabricated on (1120) Face", The Japanese Society of Applied Physics, Nov. 15, 2001, vol. 40, pp. 1201-1203.
Shenoy, Jayarama N. et al., "High-Voltage Double-Implanted Power MOSFET's in 6H—SiC", IEEE Electron Device Letters, Mar. 1997, vol. 18, No. 3, pp. 93-95.
Shenoy, Praveen M. et al., "The Planar 6H—SiC Accufet: A New High-Voltage Power MOSFET Structure", IEEE Electron Device Letters, Sep. 1999, vol. 18, No. 12, pp. 589-591.
Singh, R. et al., "Planar Terminations in 4H—SIC Schottky Diodes with Low Leakage and High Yields", ISPSD '97, May 1997, pp. 157-160.
Singh, R. et al., "High Temperature, High Current, 4H—SiC Accu-DMOSFET", Silicon Carbide and Related Materials, Copyright: 2000, vols. 338-342, pp. 1271-1274.
Sridevan, S. et al., "Lateral N-Channel Inversion Mode 4H—SiC MOSFET'S", IEEE Electron Devices Letters, Jul. 1998, vol. 19, No. 7, pp. 228-230.
Sridevan, S. et al., "On the Prescence of Aluminum in Thermally Grown Oxides on 6H—Silicon Carbide", IEEE Electron Devices Letters, Mar. 1996, vol. 17, No. 3, pp. 136-138.
Stengl, R. et al., "Variation of Lateral Doping—A New Concept to Avoid High Voltage Breakdown of Planar Junctions", Science Research Laboratories, Jan. 12, 1985, 4 pages.
Stengl, R. et al., "Variation of Lateral Doping as a Field Terminator for High-Voltage Power Devices", IEEE Transactions on Electron Devices, Mar. 1986, vol. ED-33, No. 3, pp. 426-428.
Streetman, Ben G., "Chapter 7: Bipolar Junction Transistors", Solid State Electronic Devices, Mar. 1980, pp. 228-284, Englewood Cliffs, NJ, Prentice-Hall, Inc.
Sugawara, Yoshitaka et al., "3.6 kV 4H—SiC JBS Diodes with Low RonS", Materials Science Forum: Silicon Carbide and Related Materials, Sep. 2000, vol. 338-342, pp. 1183-1186.
Sundaresan, Siddarth G. et al., "Ultra-Low Resistivity Al+ Implanted 4H—SiC Obtained by Microwave Annealing and a Protective Graphite Cap", Solid-State Electronics 52, Jan. 2008, pp. 140-145.
Suvorov, A.V. et al., "4H—Sic Self-Aligned Implant-Diffused Structure for Power DMOSFETs", Materials Science Forum, Jan. 2000, vols. 338-342, pp. 1275-1278.
Suzuki, Seiji et al., "Effect of Post-Oxidation-Annealing in Hydrogen on SiO2 /4H—SiC Interface", Materials Science Forums, Jan. 2000, vols. 338-342, pp. 1073-1076.
Sze, S.M., "Si-SiO2 MOS Diode", Physics of Semiconductor Devices, 2nd Edition, Jan. 1998, pp. 383-390, Korea, John Wiley & Sons, Inc.
Sze, S.M., "Chapter 5: Bipolar Transistor and Related Devices", Semiconductor Devices Physics and Technology, Jan. 2002, p. 130, United States of America, John Wiley & Sons, Inc.
Tamaki, Tomohiro et al., "Optimization of ON-State and Switching Performances for 15-20-kV 4H—SiC IGBTs," IEEE Transactions on Electron Devices, vol. 55, No. 8, Aug. 2008, pp. 1920-1927.
Tan, J. et al., "High-Voltage Accumulation-Layer UMOSFET's in 4H—SiC", IEEE Electron Device Letters, Sep. 1998, vol. 49, No. 12, pp. 487-489.
Thomas, Chris et al., "Annealing of Ion Implantation Damage in SiC Using a Graphite Mask", Materials Research Society Symposium Proc., Apr. 1999, vol. 572, pp. 45-50.
Tobin, Philip et al., "Furnace Formation of Silicon Oxynitride Thin Dielectrics in Nitrous Oxide N2O: The Role of Nitric Oxide (NO)", Junior Applied Physics, Feb. 1, 1994, vol. 75, No. 3, pp. 1811-1817.
Tone, Kiyoshi et al., "4H—SiC Normally-Off Vertical Junction Field-Effect Transistor With High Current Density," IEEE Electron Device Letters, vol. 24, No. 7, Jul. 2003, pp. 463-465.
International Search Report and Written Opinion for PCT/US2014/037977, mailed Sep. 15, 2014, 11 pages.
International Preliminary Report on Patentability for International Application No. PCT/US2012/051429, mailed Mar. 20, 2014, 9 pages.
Non-Final Office Action for U.S. Appl. No. 13/588,329, mailed Apr. 22, 2014, 21 pages.
Treu, M. et al., "A Surge Current Stable and Avalanche Rugged SiC Merged pn Schottky Diode Blocking 600V Especially Suited for PFC Applications", Materials Science Forum: Silicon Carbide and Related Materials, Oct. 2006, vol. 527-539, pp. 1155-1158.

(56) References Cited

OTHER PUBLICATIONS

Ueno, Katsunori et al., "The Guard-Ring Termination for High-Voltage SiC Schottky Barrier Diodes", IEEE Electron Device Letters, Jul. 1995, vol. 16, No. 7, pp. 331-332.

Ueno, Katsunori et al., "4H—SiC MOSFET's Utilizing the H2 Surface Cleaning Technique", IEEE Electron Device Letters, Jul. 1998, vol. 19, No. 7, pp. 244-246.

Ueno, Katsunori et al., "Counter-Doped MOSFET's of 4H—SiC", IEEE Electron Device Letters, Dec. 1999, vol. 20, No. 12, pp. 624-626.

Vassilveski, K. et al., "High Voltage Silicon Carbide Schottky Diodes with Single Zone Junction Termination Extension", Materials Science Forum, Sep. 2007, pp. 873-876, Switzerland, Trans Tech Publications.

Vassilveski, K.V. et al., "Protection of Selectively Implanted and Patterned Silicon Carbide Surfaces with Graphite Capping Layer During Post-Implantation Annealing", Semiconductor Science and Technology, Feb. 3, 2005, pp. 271-278, Switzerland, Trans Tech Publications.

Vathulya, Vickram et al., "A Novel 6H—SiC Power DMOSFET with Implanted P-Well Spacer", IEEE Electron Device Letters, Jul. 1999, vol. 20, No. 7, pp. 354-356.

Vathulya, Vickram et al., "Characterization of Channel Mobility of Implanted SiC to Determine Polytype Suitability for the Power DIMOS Structure", Powerpoint Presentation at Lehigh University, Presented 1999, 26 total slides, 13 pages.

Wang, Xiewen W. et al., "High Temperature Characteristics of High-Quality SiC MIS Capacitors with O/N/O Gate Dielectric", IEEE Transactions on Electron Devices, Feb. 2000, vol. 47, No. 2, pp. 450-462.

Wang, Y. et al., "Accumulation-Mode SiC Power MOSFET Design Issues", Material Science Forum, Feb. 2000, vols. 338-342, pp. 1287-1290.

Williams, J.R. et al., "Passivation of the 4H—SiC/SiO2 Interface with Nitric Oxide", Materials Science Forum, Jan. 2002, vols. 389-393, pp. 967-972.

Xu, J.P. et al., "Improved Performance and Reliability of N20-Grown Oxynitride on 6H—SiC", IEEE Electron Device Letters, Jun. 2000, vol. 21, No. 6, pp. 298-300.

Yilmaz, Hamza, "Optimization and Surface Charge Sensitivity of High Voltage Blocking Structures with Shallow Junctions", IEEE Transactions on Electron Devices, Jul. 1991, vol. 38, No. 7, pp. 1666-1675.

Zhang, Qingchun at al., "A 10-K Monolithic Darlington Transistor with βforced of 336 in 4H—SiC", Feb. 2009, IEEE Electron Device Letters, Feb. 2009, vol. 30, No. 2, pp. 142-144.

Zhang, Qingchun et al., "12 Kv 4H—SiC p-IGBTs with Record Low Specific on-Resistance", Materials Science Forum, Sep. 2008, vols. 600-603, 4 pages.

Zhang, Qingchun et al., "Design and Fabrications of High Voltage IGBTs on 4H—SiC", Power semiconductor devices and IC's, 2006 IEEE International Symposium, Jun. 4-8, 2006, pp. 1-4.

Office Action for Chinese Patent Application No. 2007800294605, mailed Jan. 22, 2010, 7 pages.

European Search Report for European Patent Application No. 09177558.5, mailed Feb. 22, 2010, 6 pages.

European Search Report for European Patent Application No. 07120038.0, mailed Jun. 16, 2008, 7 pages.

European Search Report for European Patent Application No. 09163424.6, mailed Apr. 9, 2010, 10 pages.

Extended European Search Report for European Patent Application No. 07112298.0, mailed Feb. 18, 2009, 12 pages.

International Search Report and Written Opinion for International Patent Application No. PCT/US2012/051429 mailed Nov. 22, 2012, 15 pages.

International Search Report for International Patent Application No. PCT/US01/30715 mailed Jun. 5, 2002, 9 pages.

International Search Report for International Patent Application No. PCT/US01/42414, mailed Apr. 23, 2002, 10 pages.

International Search Report for International Patent Application No. PCT/US02/11691, mailed Dec. 17, 2002, 9 pages.

International Search Report for International Patent Application No. PCT/US2004/004982 mailed Jul. 22, 2004, 13 pages.

International Search Report for International Patent Application No. PCT/US2010/025053, mailed Jul. 2, 2010, 14 pages.

International Search Report and Written Opinion for International Patent Application No. PCT/US2012/27255 mailed Jun. 13, 2012, 10 pages.

International Search Report and Written Opinion for International Patent Application No. PCT/US2007/0014139, mailed Feb. 4, 2008, 15 pages.

International Search Report and Written Opinion for International Patent Application No. PCT/US2008/0008574, mailed Sep. 26, 2008, 15 pages.

International Search Report and Written Opinion for International Patent Application No. PCT/US2008/0010538, mailed Dec. 22, 2008, 13 pages.

International Search Report for International Patent Application No. PCT/US2009/0000734, mailed Apr. 23, 2009, 13 pages.

International Search Report and Written Opinion for International Patent Application No. PCT/US2009/0003089, mailed Aug. 20, 2009, 16 pages.

International Search Report and Written Opinion for International Patent Application No. PCT/US2009/0065251, mailed Jun. 1, 2010, 14 pages.

International Search Report and Written Opinion for International Patent Application No. PCT/US2010/0020071, mailed Mar. 26, 2010, 14 pages.

Invitation to Pay Additional Fee for International Patent Application No. PCT/US2007/0010192, mailed Oct. 29, 2007, 10 pages.

International Search Report and Written Opinion for International Patent Application No. PCT/US2008/004239, mailed Mar. 2, 2009, 14 pages.

International Search Report and Written Opinion for International Patent Application No. PCT/US2010/0026632, mailed Oct. 8, 2010, 16 pages.

International Search Report and Written Opinion for International Patent Application No. PCT/US2010/0028612, mailed Jun. 17, 2010, 10 pages.

International Search Report and Written Opinion for International Patent Application No. PCT/US2010/0035713, mailed Jul. 27, 2010, 14 pages.

International Search Report and Written Opinion for International Patent Application No. PCT/US2010/0042075, mailed Sep. 24, 2010, 15 pages.

Non-Final Office Action for U.S. Appl. No. 13/108,440, mailed Aug. 2, 2012, 23 pages.

Non-Final Office Action for U.S. Appl. No. 13/102,510, mailed Aug. 2, 2012, 32 pages.

Final Office Action for U.S. Appl. No. 13/108,440, mailed Jan. 17, 2013, 36 pages.

Final Office Action for U.S. Appl. No. 13/102,510, mailed Feb. 12, 2013, 27 pages.

Advisory Action for U.S. Appl. No. 13/108,440, mailed Mar. 25, 2013, 4 pages.

Advisory Action for U.S. Appl. No. 13/102,510, mailed Apr. 19, 2013, 3 pages.

Non-Final Office Action for U.S. Appl. No. 13/102,510, mailed Jun. 20, 2013, 28 pages.

Restriction Requirement for U.S. Appl. No. 13/588,329, mailed Aug. 26, 2013, 7 pages.

Final Office Action for U.S. Appl. No. 13/588,329, mailed Feb. 20, 2015, 18 pages.

Reason for Rejection for Japanese Patent Application No. 2014-529750, mailed Apr. 15, 2015, 8 pages.

Non-Final Office Action for U.S. Appl. No. 14/277,820, mailed Jun. 16, 2015, 13 pages.

Kazuhiro, I. et al., "Simultaneous Formation of Ni/Al Ohmic Contacts to Both n- and p-Type 4H—SiC," Journal of Electronic Materials, vol. 37, No. 11, 2008, TMS, pp. 1674-1680.

Extended European Search Report for European Patent Application No. 12782360.7, mailed Oct. 7, 2014, 7 pages.

(56) References Cited

OTHER PUBLICATIONS

Office Action for Japanese Patent Application No. 2014-509288, mailed Nov. 25, 2014, 10 pages.
International Preliminary Report on Patentability for PCT/US2012/027255, mailed Nov. 21, 2013, 7 pages.
Final Office Action for U.S. Appl. No. 13/102,510, mailed Nov. 29, 2013, 22 pages.
Advisory Action for U.S. Appl. No. 13/102,510, mailed Feb. 6, 2014, 3 pages.
Non-Final Office Action for U.S. Appl. No. 13/102,510, mailed Mar. 13, 2014, 10 pages.
Final Office Action for U.S. Appl. No. 13/102,510, mailed Aug. 29, 2014, 9 pages.
Notice of Allowance for U.S. Appl. No. 13/102,510, mailed Jan. 12, 2015, 9 pages.
Corrected Notice of Allowability for U.S. Appl. No. 13/102,510, mailed Mar. 26, 2015, 4 pages.
Non-Final Office Action for U.S. Appl. No. 13/108,440, mailed Dec. 30, 2013, 104 pages.
Final Office Action for U.S. Appl. No. 13/108,440, mailed Jun. 24, 2014, 69 pages.
Non-Final Office Action for U.S. Appl. No. 13/108,440, mailed Jan. 14, 2015, 10 pages.
Notice of Allowance for U.S. Appl. No. 13/108,440, mailed Jun. 2, 2015, 16 pages.
Corrected Advisory Action for U.S. Appl. No. 13/588,329, faxed Aug. 19, 2015, 3 pages.
First Office Action and Search Report for Chinese Patent Application No. 201280055081.4, mailed Feb. 1, 2016, 31 pages.
Decision of Rejection for Japanese Patent Application No. 2014-529750, mailed Feb. 26, 2016, 6 pages.
Non-Final Office Action for U.S. Appl. No. 13/588,329, mailed Feb. 3, 2016, 18 pages.
International Preliminary Report on Patentability for PCT/US2014/037977, mailed Nov. 26, 2015, 8 pages.
International Search Report and Written Opinion for No. PCT/US2015/030853, mailed Nov. 5, 2015, 15 pages.
Notice of Allowance for U.S. Appl. No. 14/277,820, mailed Nov. 27, 2015, 9 pages.
Non-Final Office Action for U.S. Appl. No. 13/588,329, mailed Jun. 27, 2016, 19 pages.
Notice of Allowance for U.S. Appl. No. 14/277,820, mailed May 25, 2016, 6 pages.
Report of Reexamination before Appeal for Japanese Patent Application No. 2014-529750, mailed Aug. 18, 2016, 6 pages.
Notice of Allowance for U.S. Appl. No. 13/588,329, mailed Dec. 23, 2016, 10 pages.
Second Office Action for Chinese Patent Application No. 201280055081.4, issued Nov. 8, 2016, 20 pages.
International Preliminary Report on Patentability for No. PCT/US2015/030853, mailed Nov. 24, 2016, 10 pages.
Berning, David W. et al., "High-Voltage Isolated Gate Drive Circuit for 10 kV, 100 a SiC MOSFET/JBS Power Modules," IEEE Industry Applications Society Annual Meeting, Oct. 5-9, 2008, IEEE, pp. 1-7.
Grider, David et al., "10kV/120 a SiC DMOSFET Half H-Bridge Power Modules for 1 MVA Solid State Power Substation," IEEE Electric Ship Technologies Symposium (ESTS), Apr. 10-13, 2011, IEEE, pp. 131-134.
Examination Report for European Patent Application No. 12762112.6, mailed Feb. 1, 2017, 4 pages.
Corrected Notice of Allowability for U.S. Appl. No. 13/588,329, mailed Jan. 25, 2017, 7 pages.
Corrected Notice of Allowability for U.S. Appl. No. 13/588,329, mailed Mar. 13, 2017, 7 pages.

\* cited by examiner

| L9 | TOP METAL LAYER |
| L8 | DEVICE LAYERS (i.e., MOSFET/DIODE) |
| L7 | 1ST BACK METAL LAYER |
| L6 | 2ND BACK METAL LAYER |
| L5 | SOLDER |
| L4 | TOP TRACE LAYER |
| L3 | SUBSTRATE |
| L2 | BOTTOM TRACE LAYER |
| L1 | SOLDER |
| L0 | BASE PLATE |

HIGH PERFORMANCE POWER MODULE

CROSS REFERENCE TO RELATED APPLICATIONS

This application is a continuation in part of U.S. patent application Ser. No. 13/588,329, which was filed Aug. 17, 2012 and claims the benefit of U.S. provisional patent application No. 61/533,254 filed Sep. 11, 2011, the disclosures of which are incorporated herein by reference in its entirety. The present application is related to U.S. patent application Ser. No. 13/108,440, now U.S. Pat. No. 9,142,662, filed May 16, 2011, which is a continuation in part of U.S. patent application Ser. No. 13/102,510, now U.S. Pat. No. 9,029,945, filed May 6, 2011, the disclosures of which are incorporated herein by reference in their entireties.

FIELD OF THE DISCLOSURE

The present disclosure relates to electronic devices and in particular to power modules.

BACKGROUND

Power devices made with silicon carbide (SiC) are expected to show great advantages as compared to those on silicon for high speed, high power and/or high temperature applications due to the high critical field and wide band gap of SiC. For devices capable of blocking high voltages, such as voltages in excess of about 5 kV, it may be desirable to have bipolar operation to reduce the drift layer resistance via conductivity modulation resulting from injected minority carriers. However, one technical challenge for bipolar devices in silicon carbide is forward voltage degradation over time, possibly due to the presence of Basal Plane Dislocations (BPD) in single crystals of silicon carbide. Thus, unipolar devices such as SiC Schottky diodes and MOSFETs are typically used for high power applications, e.g., up to 10 kV or more.

SiC DMOSFET devices with a 10 kV blocking capability have been fabricated with a specific on-resistance of about 100 m$\Omega \times$cm$^2$. DMOSFET devices may exhibit very fast switching speeds of, for example, less than 100 ns, due to their majority carrier nature. However, as the desired blocking voltage of devices increases, for example up to 15 kV or more, the on-resistance of a MOSFET device may increase substantially, due to the corresponding increase in the drift layer thickness. This problem may be exacerbated at high temperatures due to bulk mobility reduction, which may result in excessive power dissipation.

With the progress of SiC crystal material growth, several approaches have been developed to mitigate BPD related problems. See, e.g., B. Hull, M. Das, J. Sumakeris, J. Richmond, and S. Krishinaswami, "Drift-Free 10-kV, 20-A 4H-SiC PiN Diodes", Journal of Electrical Materials, Vol. 34, No. 4, 2005, which is incorporated herein by reference in its entirety. These developments may enhance the development and/or potential applications of SiC bipolar devices such as thyristors, GTOs, etc. Even though thyristors and/or GTOs may offer low forward voltage drops, they may require bulky commutating circuits for the gate drive and protections. Accordingly, it may be desirable for a SiC bipolar device to have gate turn-off capability. Due to their superior on-state characteristics, reasonable switching speed, and/or excellent safe-operation-area (SOA), 4H-SiC insulated gate bipolar transistors (IGBTs) are becoming more suitable for power switching applications.

These devices are used in power modules, which operate to dynamically control large amounts of power through switching for motors, inverters, generators, and the like. There is a continuing need for power modules that are smaller and less expensive to manufacture while at the same time being capable of controlling larger loads.

SUMMARY

The present disclosure relates to a power module that has a housing with an interior chamber and a plurality of switch modules interconnected to facilitate switching power to a load. Each of the plurality of switch modules comprises at least one transistor and at least one diode mounted within the interior chamber and both the at least one transistor and the at least one diode are majority carrier devices, are formed of a wide bandgap material system, or both. The switching modules may be arranged in virtually any fashion depending on the application. For example, the switching modules may be arranged in a six-pack, full H-bridge, half H-bridge, single switch, or the like.

In one embodiment, the transistors and diodes are formed from silicon carbide (SiC), the transistors are MOSFETs, and the diodes are Schottky diodes or junction barrier Schottky diodes. The transistors and diodes may be coupled in anti-parallel as well as be provided in arrays to increase power-handling capabilities. The devices of the present disclosure are very efficient and cost effective to manufacture while exceeding the performance currently available state-of-the-art products. For example, a six-pack power module employing SiC MOSFETS and junction barrier Schottky diodes in the switching modules can block 1200 volts, conduct 50 amperes, and have switching losses of well less than ten milli-Joules. As such, switching losses with this power module are around 70% less than currently available state-of-the-art products that have the same blocking and conduction ratings. Further, these devices are able to operate at significantly higher switching frequencies.

BRIEF DESCRIPTION OF THE DRAWINGS

The accompanying drawings, which are included to provide a further understanding of the disclosure and are incorporated in and constitute a part of this application, illustrate certain embodiment(s) of the disclosure. In the drawings.

DETAILED DESCRIPTION OF EMBODIMENTS OF THE DISCLOSURE

Figure 1:
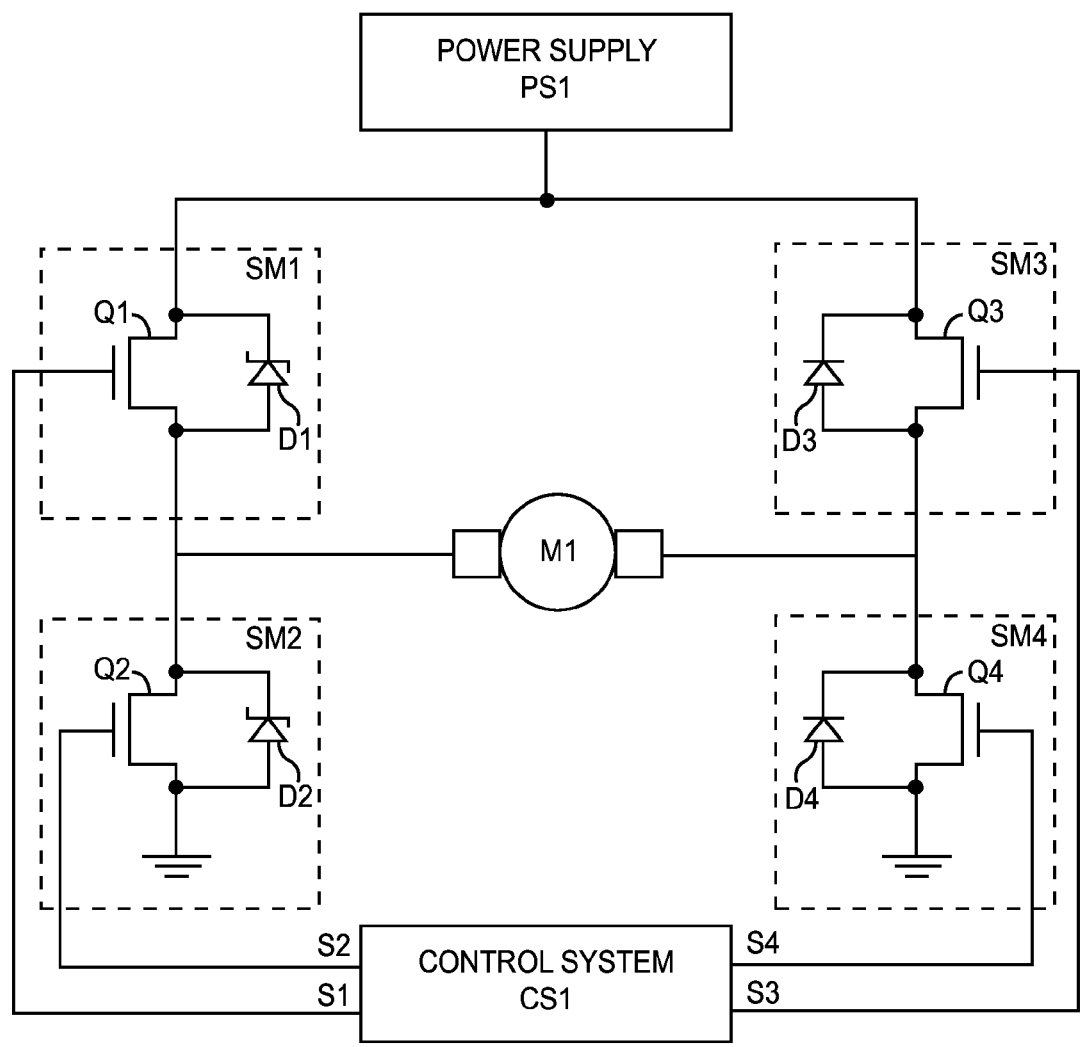
FIG. 1 is a circuit diagram of an H-bridge for an exemplary power module that is configured to drive a motor.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Some embodiments of the disclosure are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

An exemplary system that employs a power module is illustrated in FIG. 1. As depicted, the power module can include four switch modules SM1-SM4, which are controlled by a control CS1 to deliver power from a power supply PS1 to a load in a controlled manner. The switch modules SM1 and SM2 form a first half of an H-bridge, while switch modules SM3 and SM4 form a second half of the H-bridge. As noted, power modules are often used to drive an inductive load, such as that provided by a direct current (DC) motor M1. The details of the switch modules SM1-SM4 are described in further detail below.

For now, assume the switch modules SM1-SM4 can include at least one transistor in parallel with an internal or external diode that is connected in anti-parallel with the transistor. The transistors are illustrated as metal oxide field effect transistors (MOSFETs), and the diodes are illustrated as Schottky diodes for purposes of description. The MOSFETs may be replaced with other types of transistors, such as bipolar transistors, including insulated gate bipolar transistors (IGBTs), and various kinds of field effect transistors (FETs), such as junction field effect transistors (JFETs), and high electron mobility transistors (HEMTs). Similarly, the Schottky diodes may be replaced with traditional p-n diodes.

As illustrated, switch module SM1 may include either an n-channel or p-channel MOSFET Q1 that has a Schottky diode D1 connected in anti-parallel across the drain and source terminals of the MOSFET Q1. Switch modules SM2-SM4 are similarly configured. Switch module SM2 includes an n-channel MOSFET Q2 that has a Schottky diode D2 connected in anti-parallel across the drain and source terminals of the MOSFET Q2. Switch module SM3 may include either an n-channel or p-channel MOSFET Q3 that has a Schottky diode D3 connected in anti-parallel across the drain and source terminals of the MOSFET Q3. Switch module SM4 includes an n-channel MOSFET Q4 that has a Schottky diode D4 connected in anti-parallel across the drain and source terminals of the MOSFET Q4.

The switch modules SM1 and SM3 are considered on the "high" side, and the switch modules SM2 and SM4 are considered on the "low" side of the power module. The drains of MOSFETs Q1 and Q3 and the cathodes of diodes D1 and D3 are coupled together and to the power supply PS1. The source of MOSFET Q1, the anode of diode D1, the drain of MOSFET Q2, and the cathode of diode D2 are coupled together and to a first terminal of the motor M1. The source of MOSFET Q3, the anode of diode D3, the drain of MOSFET Q4, and the cathode of diode D4 are coupled together and to a second terminal of the motor M1. Finally, the sources of MOSFETs Q2 and Q4 and the anodes of diodes D2 and D4 are coupled to ground. The gates of MOSFETs Q1-Q4 are respectively driven by control signals S1-S4, which are provided by the control system CS1. Assume the motor M1 may be driven in both forward and reverse directions.

Figure 2:
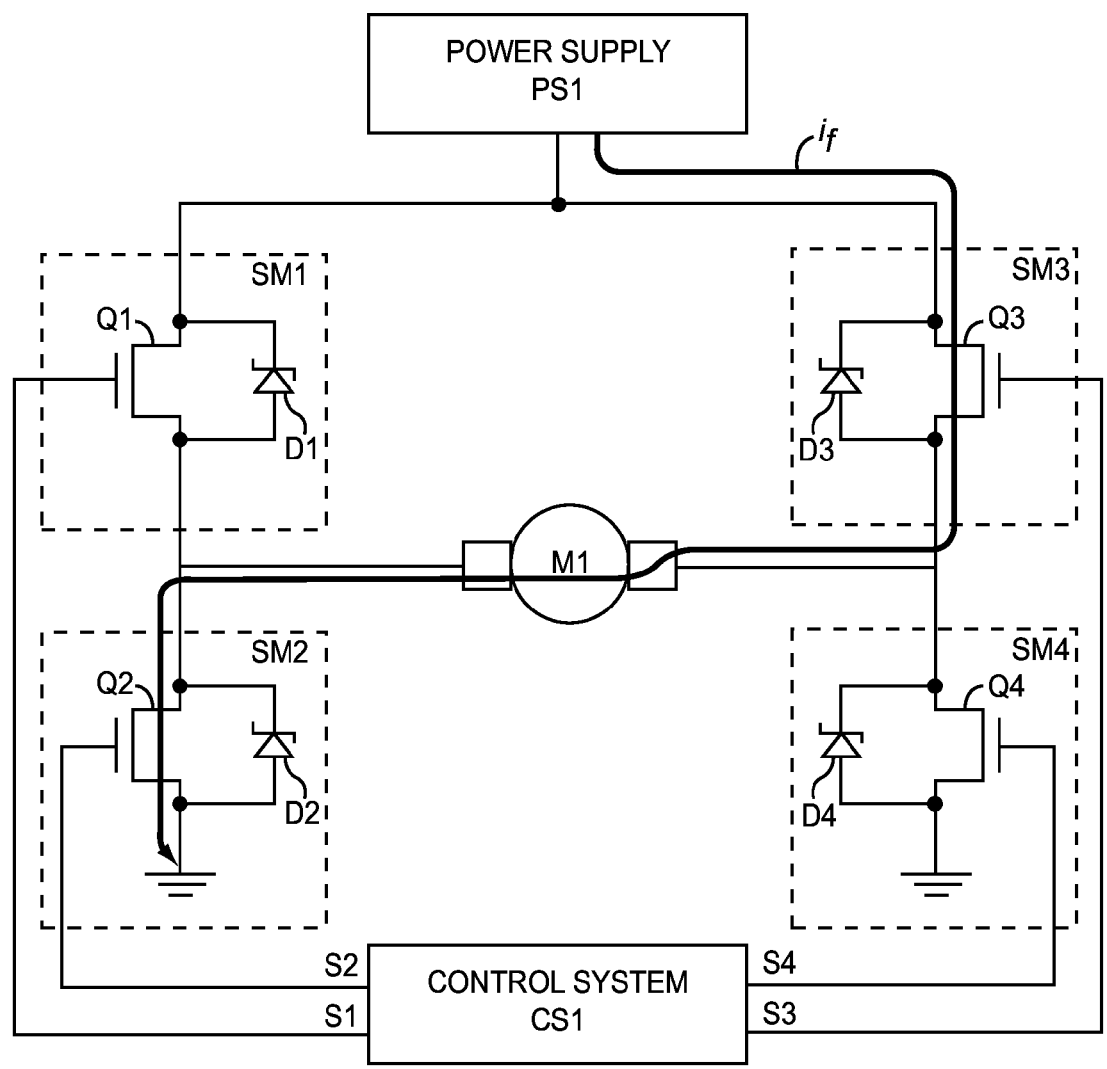
FIG. 2 illustrates a first current path in the H-bridge of FIG. 1 when driving the motor in a first direction.

For forward operation, assume control signals S1-S4 are configured to turn on MOSFETs Q2 and Q3 and turn off MOSFETs Q1 and Q4, which corresponds to driving the motor M1 in a forward direction. As illustrated in FIG. 2, a forward current $i_f$ flows from the power supply PS1 through MOSFET Q3, the motor M1, and the MOSFET Q2 to ground. If MOSFETs Q2 and Q3 stay on, the maximum forward current $i_f$ is provided and the motor M1 will turn in the forward direction at a maximum speed, with maximum torque, or a combination thereof.

To control the speed or torque, one or both of the MOSFETs Q2 and Q3 may be switched off and on at a duty cycle that corresponds to the speed or torque desired from the motor M1. As a result, the voltage supplied to the motor M1 is pulse width modulated, wherein the on-to-off switching ratio of the MOSFETs Q2 and Q3 dictates the average voltage presented to the Motor M1. The inductive nature of the motor M1 tries to keep the forward current $i_f$ constant, and as a result, averages the voltage presented to the motor M1 to a level corresponding to the on-to-off switching ratio of the MOSFETs Q2 AND Q3. The average voltage presented to the motor M1 dictates the forward current $i_f$ that is passed through the motor M1, and thus, controls the actual speed or torque of the motor M1.

Figure 3:
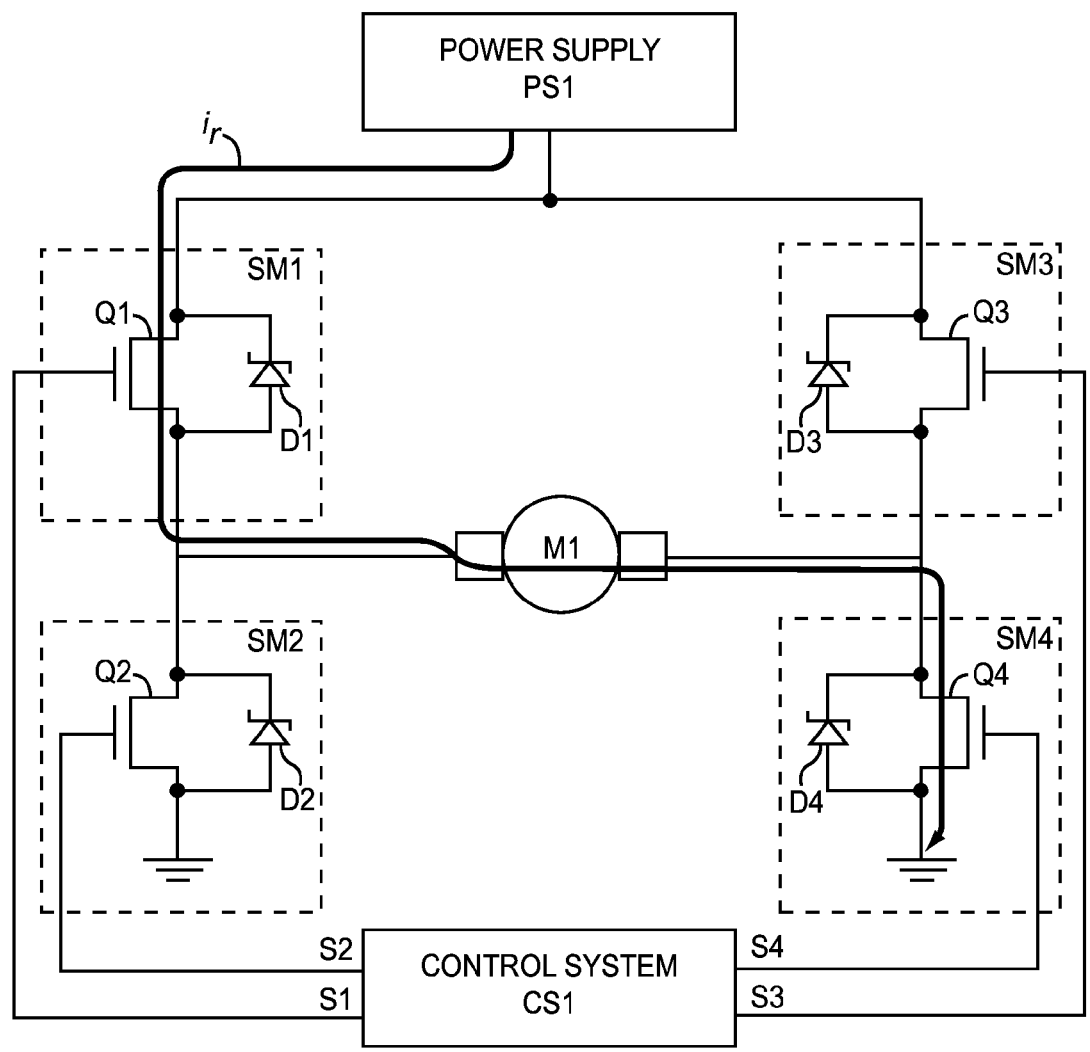
FIG. 3 illustrates a second current path in the H-bridge of FIG. 1 when driving the motor in a second direction.

For reverse operation, assume control signals S1-S4 are configured to turn on MOSFETs Q1 and Q4 and turn off MOSFETs Q2 and Q3. As illustrated in FIG. 3, a reverse current $i_r$ flows from the power supply PS1 through MOSFET Q1, the motor M1, and the MOSFET Q4 to ground. If MOSFETs Q1 and Q4 stay on, the maximum reverse current $i_r$ is provided and the motor M1 will turn in the reverse direction at a maximum speed, with maximum torque, or a combination thereof. Notably, the term "reverse" when used as an adjective in the term "reverse current $i_r$," merely refers to the direction of operation for the motor M1. The arrows provided in FIGS. 2 and 3, respectively, indicate the direction of current flow for both the forward current $i_f$ and the reverse current $i_r$.

As described above, the various MOSFETs Q1-Q4 may be turned on and off at a relatively high frequency to provide pulse width modulated voltage to the motor M1 for either forward or reverse operation as well as to switch from forward operation to reverse operation. When a pair of MOSFETs, such as MOSFETs Q2 and Q3 transition from an on-state to an off-state during forward operation, the forward current $i_f$ continues to flow through the motor M1 after the MOSFETs Q2 and Q3 are turned off, due to the electromagnetic field that is present in the inductive windings of the motor M1. At this point, all of the MOSFETs Q1-Q4 are off, yet the forward current $i_f$ remains flowing through the motor M1. Since the forward current $i_f$ cannot flow through any of the MOSFETs Q1-Q4 to a lower potential node, one or more of the Schottky diodes D1 though D4 may become forward biased and provide a path for the forward current $i_f$ to flow to either ground or the power supply PS1.

Figure 4:
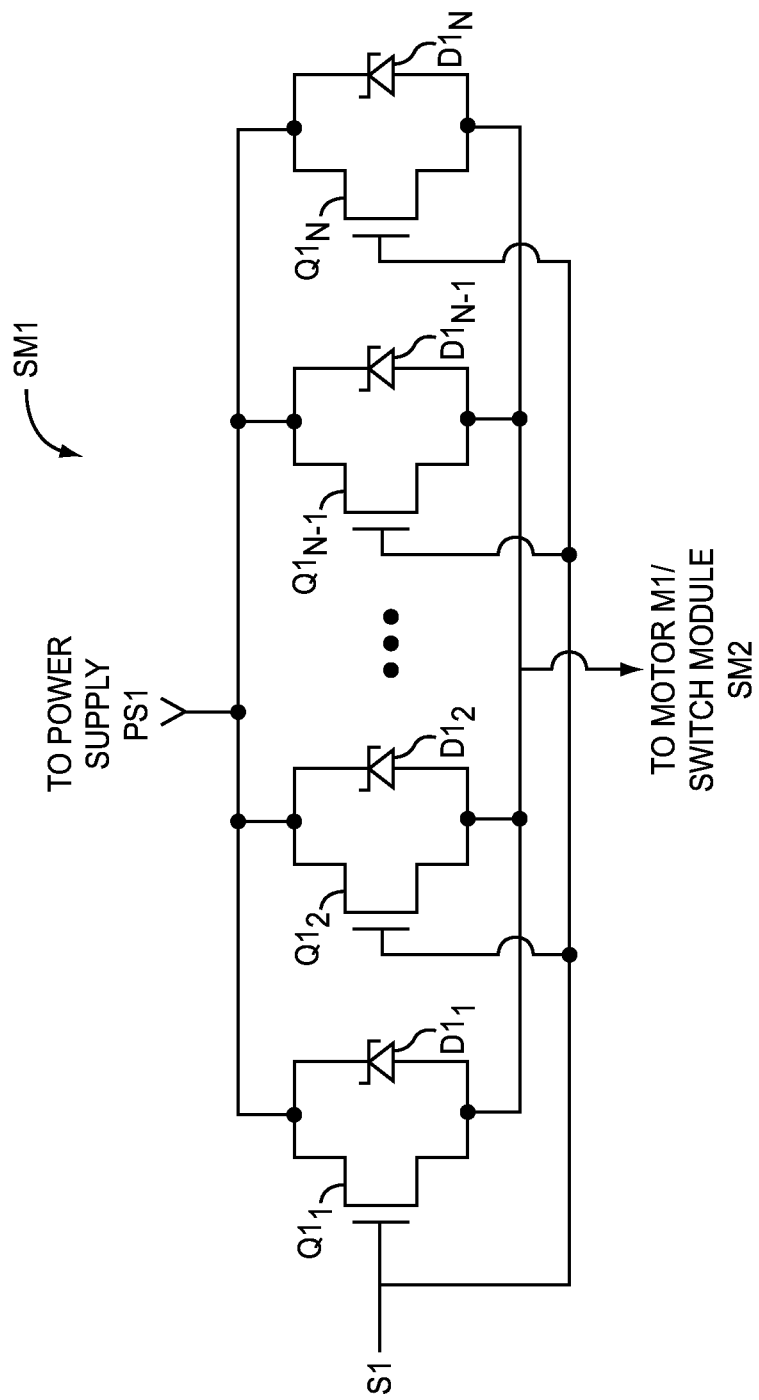
FIG. 4 is a circuit diagram of a switch module of the H-bridge of FIG. 1.

To increase the power handling of a switch module SM1-SM4, each of the MOSFETs Q1-Q4 may represent an array of effectively parallel transistors. Similarly, each of the Schottky diodes D1-D4 may represent an array of effectively parallel diodes. This concept is represented in FIG. 4 where an exemplary embodiment of switch module SM1 is illustrated. The other switch modules SM2-SM3 may be similarly configured.

As illustrated, switch module SM1 includes an array of MOSFETs $Q1_1$-$Q1_N$, which are effectively coupled in parallel, such that the drains are all coupled together and to the power supply PS1; the sources are all coupled together and to the motor M1 and switch module SM2; and the gates are coupled together and to the control system C1 (control signal S1). The Schottky diodes $D1_1$-$D1_N$ are coupled in anti-parallel across the drain and sources of the MOSFETs $Q1_1$-$Q1_N$. The number (N) of MOSFETs $Q1_1$-$Q1_N$ and Schottky diodes $D1_1$-$D1_N$ may range from two to more than 100, depending on the capability of each individual device and the application. Notably, there may be two or more Schottky diodes D1 for each MOSFET Q1, even though there is only a one-to-one relationship in the illustration.

Figure 5:
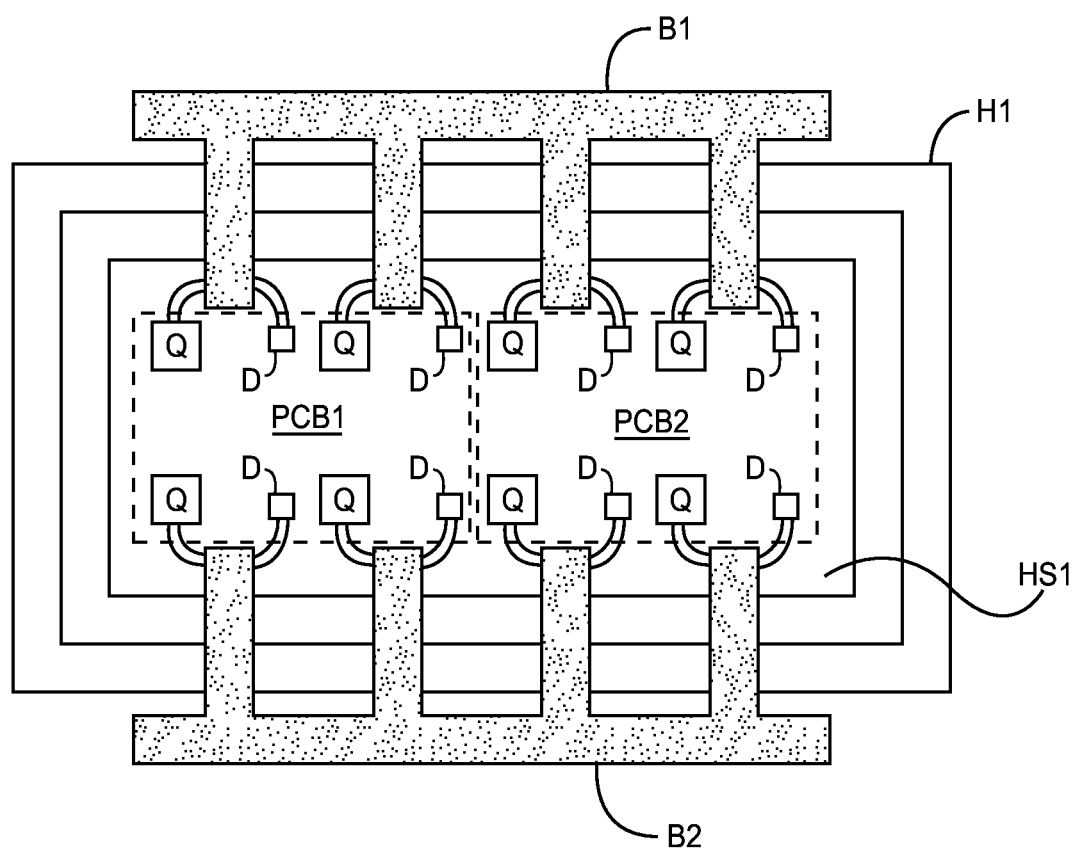
FIG. 5 is a top plan view of a power module according to one embodiment.
Figure 6:
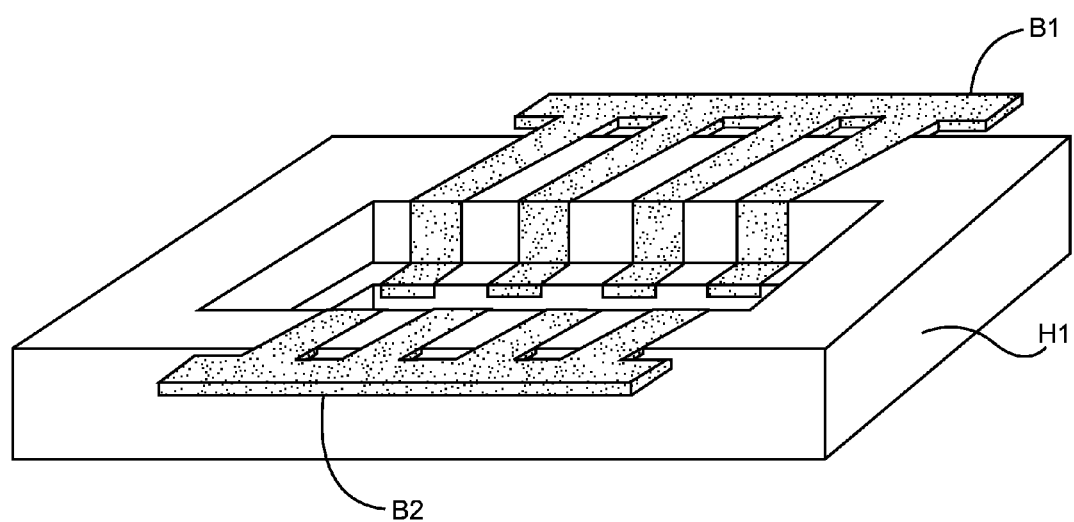
FIG. 6 is an isometric view of the power module of FIG. 5.

FIGS. 5 and 6 show top and perspective views of an exemplary power module. With reference to FIG. 5, rectangular housing H1 is provided with an interior chamber that holds one or more printed circuit boards PCB1 and PCB2. For clarity, the printed circuit boards PCB1 and PCB2 are not shown in FIG. 6. Each printed circuit board PCB1 and PCB2 is shown as having multiple transistors Q and diodes D that represent the primary components of the switch modules SW1-SW4. For example, the high and low side of the first half-H bridge formed by switch modules SW1 and SW2 are provided on printed circuit board PCB1, while the high and low side of the second half-H bridge formed by switch modules SW3 and SW4 are provided on printed circuit board PCB2. Together, the first and second half-H bridges form the above-described full-H bridge.

The necessary interconnects between the components on the printed circuit boards PCB1 and PCB2 are provided by metal traces (not shown) on the printed circuit boards PCB1 and PCB2. Bond wires may be used to make connections between the printed circuit boards PCB1 and PCB2 and one more connectors or buses B1 and B2. For example, bus B1 may be used to connect switch modules SM2 and SM4 to ground, and bus B2 may be used to connect switch modules SM1 and SM3 to the power supply PS1. These or other connectors may be used for the control signals S1-S4. The printed circuit boards PCB1 and PCB2 may be mounted to a mounting structure that is affixed to the housing H1. As illustrated, the mounting structure is a planar heat sink HS1 that also functions to dissipate heat generated by the switch modules SM1-SM4.

Again, the H-bridge configuration of the power module is just one of many available designs for power modules, especially those used to drive inductive loads. Alternatives to the H-bridge configuration for the power module include a half-H bridge and like known power switching or control circuits.

Regardless of the type of configuration of the power module, one metric for measuring the power handling capabilities of the device is current density of one of the switch modules SM1-SM4. This switch module current density is defined as the ratio of the maximum average current that a single switch module SM1-SM4 can handle to the interior area of the housing H1 that is allocated to the single switch module SM1-SM4. For the illustrated example, there are four switch modules SM1-SM4 of equal size. As such, the interior area of the housing H1 that is allocated to a single switch module SM1-SM4 is one-fourth (¼) the total interior area of the housing H1.

For example, assume the interior area of the housing H1 is 100 cm$^2$, and the maximum average current handling of one of the switch modules SM1-SM4 is 250 amperes. As such, the interior area of the housing H1 that is allocated to a single switch module SM1-SM4 is one-fourth of 100 cm$^2$, or 25 cm$^2$. The switch module current density is calculated by dividing the maximum average current handling of 250 amperes by the interior area of the housing H1 that is allocated to the single switch module SM1-SM4, which yields 10 amperes/cm$^2$.

The interior area of the housing H1 is defined as the maximum (two-dimensional) cross-sectional area of the interior of the housing H1 wherein the plane of measurement is along the plane in which one or more printed circuit boards PCB1 and PCB2 or one or more semiconductor die that provide the switch modules SM1-SM4 reside. For the illustrated example in FIG. 5, the interior area is defined by the perimeter P of the inside wall of the housing H1. The perimeter P is highlighted in bold. Notably, since the housing H1 may have various shapes and configurations in addition to the rectangular configuration shown in FIGS. 5 and 6, the interior areas need not be rectangular and the perimeter of the interior areas will follow the interior sidewalls of the housing H1. In one embodiment, the switch module current density is about 10 amperes/cm$^2$ or greater. In another embodiment, the switch module current density is about 12 amperes/cm$^2$ or greater. In another embodiment, the switch module current density is about 15 amperes/cm$^2$ or greater.

Figure 7:
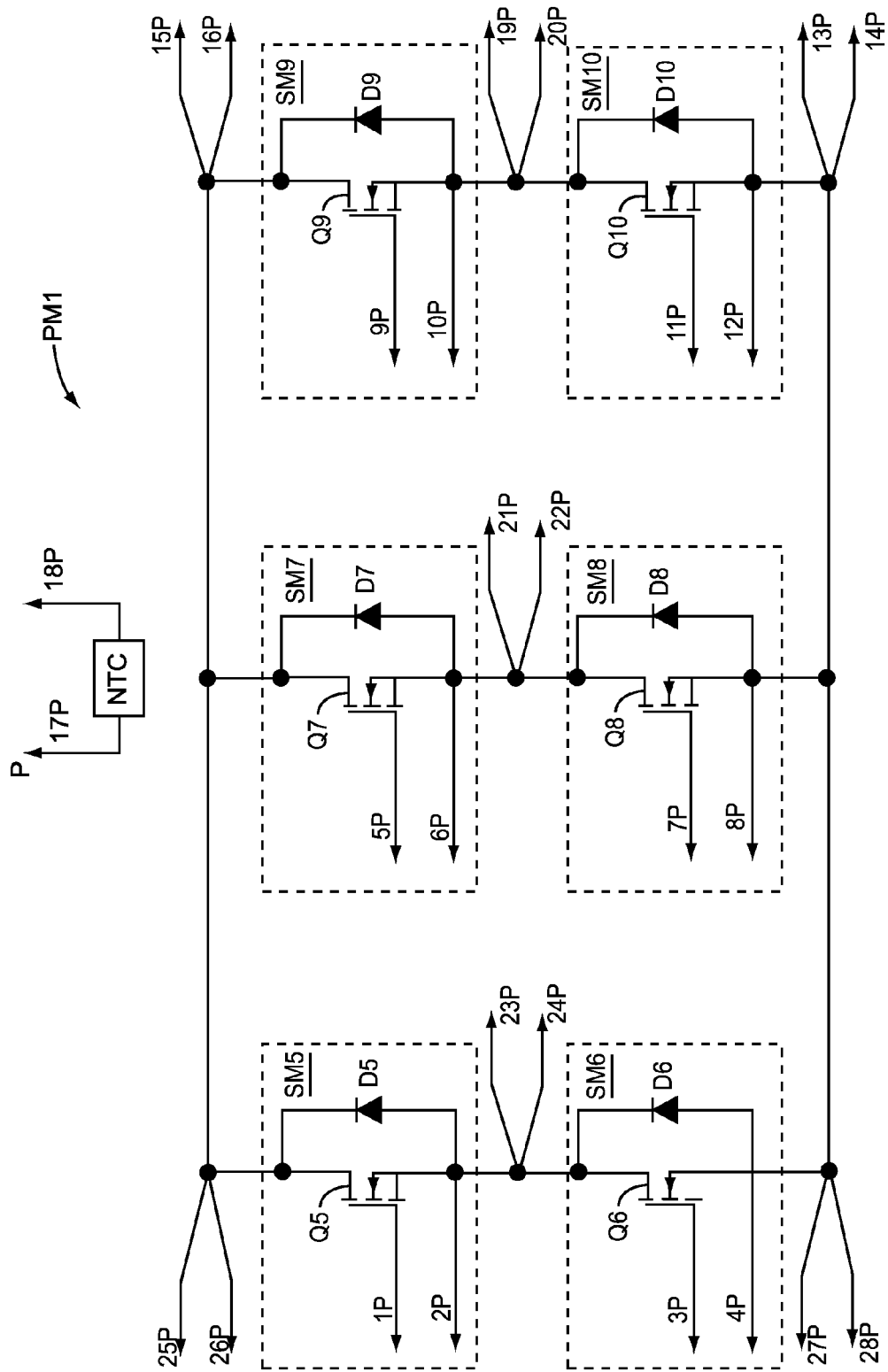
FIG. 7 is a circuit diagram of a power module according to one embodiment of the present disclosure.

Another exemplary power module PM1 is illustrated in FIG. 7. As depicted, the power module PM1 can include six switch modules SM5-SM10, which are distributed among three shunt legs. The power module PM1 is particularly useful in three-phase applications, such as three-phase inverters, three-phase motor drivers, uninterruptable power supplies, and the like. The switch modules SM5 and SM6 are series connected and form a first shunt leg of the power module PM1, the switch modules SM7 and SM8 are series connected and form a second shunt leg of the power module PM1, and the switch modules SM9 and SM10 are series connected and form a third shunt leg of the power module PM1. The details of the switch modules SM5-SM10 are described in further detail below.

The transistors are illustrated as SiC MOSFETs, and the diodes are illustrated as SiC Schottky diodes for purposes of description. However, the MOSFETs may be replaced with other types of transistors, such as bipolar transistors, including insulated gate bipolar transistors (IGBTs), and various kinds of field effect transistors (FETs), such as junction field effect transistors (JFETs), and high electron mobility transistors (HEMTs), which may be formed from any material system, such as Si, SiC, GaN, GaAs, and the like. In certain embodiments, the Schottky diodes may be replaced with traditional p-n diodes.

For the first shunt leg of the power module PM1, switch module SM5 may include either an n-channel or p-channel MOSFET Q5 that has a Schottky diode D5 connected in anti-parallel across the drain and source terminals of the MOSFET Q5. Switch modules SM6-SM10 are similarly configured. Switch module SM6 includes an n-channel MOSFET Q6 that has a Schottky diode D6 connected in anti-parallel across the drain and source terminals of the MOSFET Q6. For the second shunt leg, switch module SM7 may include either an n-channel or p-channel MOSFET Q7 that has a Schottky diode D7 connected in anti-parallel across the drain and source terminals of the MOSFET Q7. Switch module SM8 includes an n-channel MOSFET Q8 that has a Schottky diode D8 connected in anti-parallel across the drain and source terminals of the MOSFET Q8. For the third shunt leg, switch module SM9 may include either an n-channel or p-channel MOSFET Q9 that has a Schottky diode D9 connected in anti-parallel across the drain and source terminals of the MOSFET Q9. Switch module SM10 includes an n-channel MOSFET Q10 that has a Schottky diode D10 connected in anti-parallel across the drain and source terminals of the MOSFET Q10.

The switch modules SM5, SM7, and SM9 are considered on the "high" side, and the switch modules SM6, SM8, and SM10 are considered on the "low" side of the power module. The drains of MOSFETs Q5, Q7, and Q9 and the cathodes of diodes D5, D7, and D9 are coupled together and to pins 15P, 16P, 25P, and 26P. The sources of MOSFETs Q6, Q8, and Q10 and the anodes of diodes D6, D8, and D10 are coupled to ground and to pins 13P, 14P, 27P, and 28P. Multiple pins are used for certain nodes to help increase current handling capabilities of the power module PM1. To increase the power handling of a switch module SM5-SM10, each of the MOSFETs Q6-Q10 may represent an array of effectively parallel transistors. Similarly, each of the Schottky diodes D5-D10 may represent an array of effectively parallel diodes. This concept is represented in FIG. 4 where an exemplary embodiment of switch module SM1 is illustrated. The switch modules SM5-SM10 may be similarly configured.

For the first shunt leg, the source of MOSFET Q5, the anode of diode D5, the drain of MOSFET Q6, and the cathode of diode D6 are coupled together and to pins 2P, 23P, and 24P. For the second shunt leg, the source of MOSFET Q7, the anode of diode D7, the drain of MOSFET Q8, and the cathode of diode D8 are coupled together and to pins 6P, 21P, and 22P. For the third shunt leg, the source of MOSFET Q9, the anode of diode D9, the drain of MOSFET Q10, and the cathode of diode D10 are coupled together and to pins 10P, 19P, and 20P. The gates of the high-side MOSFETs Q5, Q7, and Q9 are coupled to pins 1P, 5P, and 9P, respectively. The gates of the low-side MOSFETs Q6, Q8, and Q10 are coupled to pins 3P, 7P, and 11P.

Figure 8:
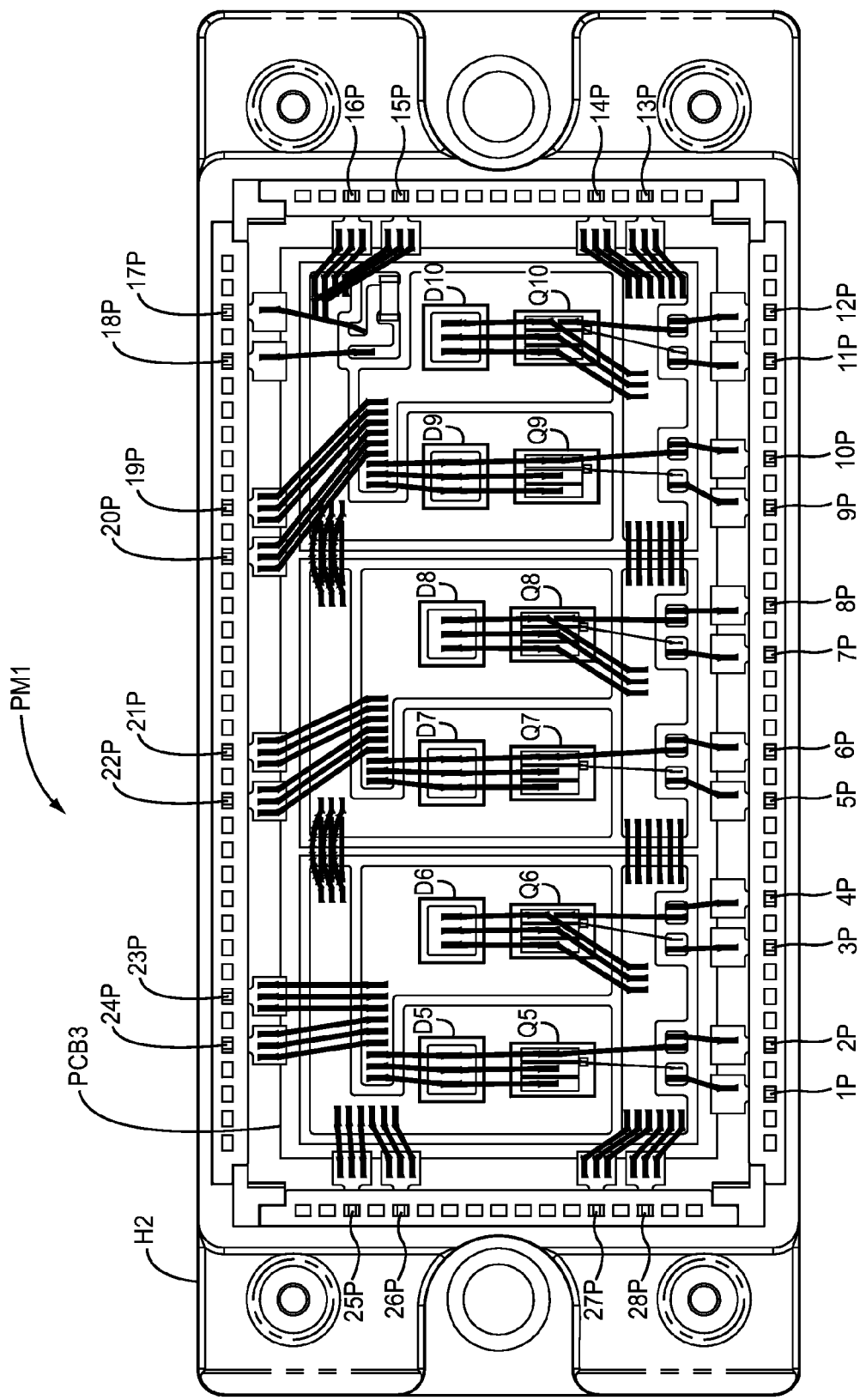
FIG. 8 is a top view of a housing for a power module according to one embodiment of the present disclosure.

FIG. 8 shows a top view of an exemplary housing H2 for power module PM1. The elongated and substantially rectangular housing H2 is provided with an interior chamber that holds one or more printed circuit boards PCB3. Printed circuit board PCB3 is shown as having multiple transistors Q5-Q10 and diodes D5-D10 that represent the primary components of the switch modules SM5-SM10. The thicker, dark lines represent wirebonds between components and between components and the various pins 1P-28P. Other interconnects between the components on the printed circuit board PCB3 are provided by metal traces. As illustrated, the mounting structure may form all or part of a heat sink that functions to dissipate heat generated by the switch modules SM5-SM10.

Figure 9:
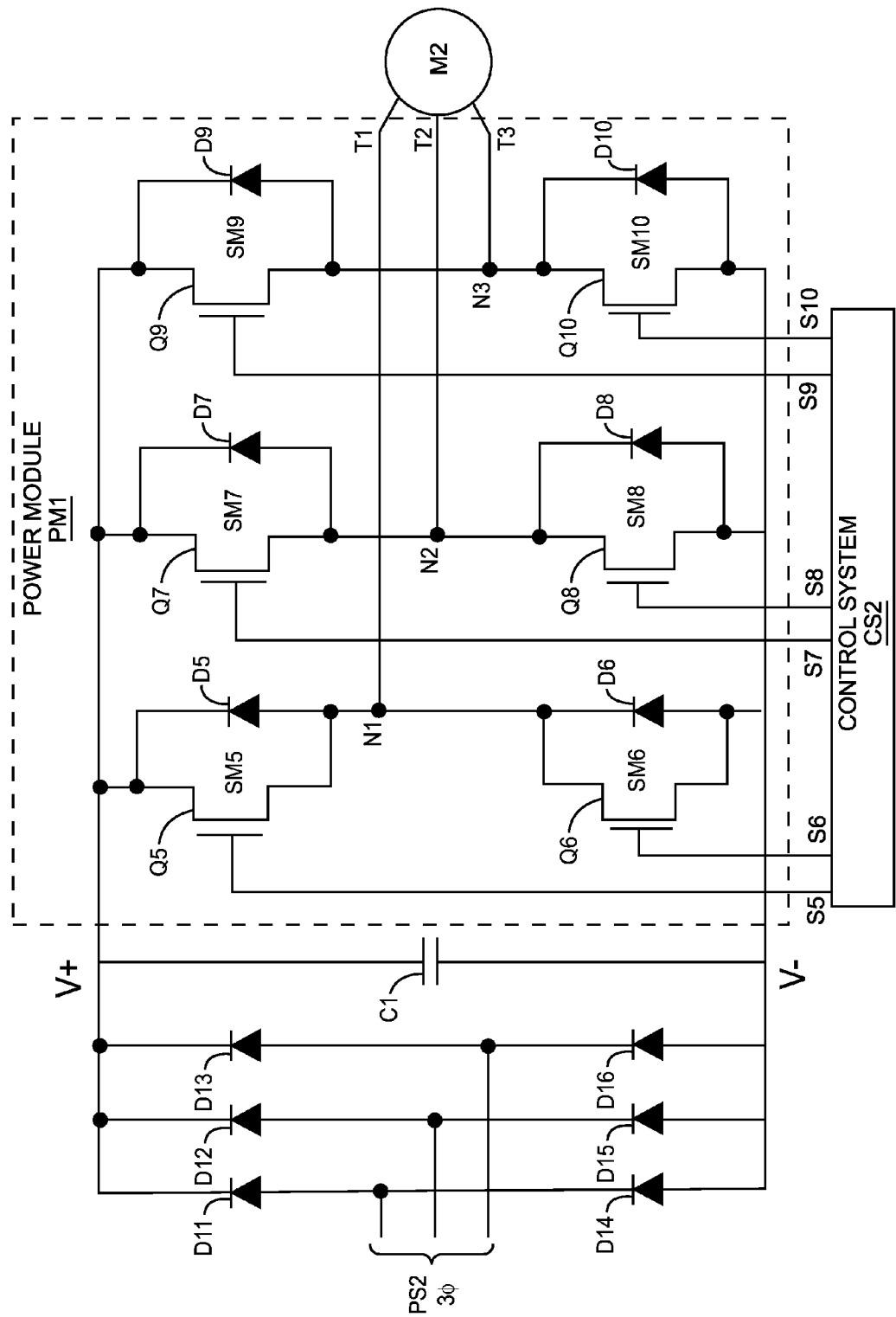
FIG. 9 is a circuit diagram of a three-phase motor drive circuit including a power module.

With reference to FIG. 9, power module PM1 is shown as part of a three-phase motor drive circuit that is coupled between a three-phase power supply PS3 and a three-phase motor M2. The three-phase motor M2 has three input terminals T1, T2, and T3. A control system CS2 is used to control generation and delivery of three drive currents to the respective input terminals T1, T2, and T3 by modulating the gates of MOSFETs Q5-Q10 of the switch modules SM5-SM10 with control signals S1-S6. The drive currents will be 120 degrees out-of-phase with one another and are varied in frequency to control speed and direction of the motor M2. Generation of the drive signals and operation of the three-phase motor drive circuit is described below.

Power supply PS2 provides three sinusoidal AC signals, which are 120 degrees out-of-phase from one another, to rectifier circuitry that is represented by diodes D11-D16 and capacitor C1. The rectifier circuitry effectively rectifies the three-phase signal and provides a rectified positive rail voltage V+ to a first bus and a rectified negative voltage V− to a second bus. The positive rail voltage V+ is provided to the drains of MOSFETs Q5, Q7, and Q9 and the cathodes of diodes D5, D7, and D9 of switch modules SM5, SM7, and SM9 via the first bus and the negative rail voltage V− is provided to the sources of MOSFETs Q6, Q8, and Q10 and anodes of diodes D6, D8, and D10 of switch modules SM6, SM8, and SM10 via the second bus.

For the first drive current, a first drive signal for terminal T1 is generated at a first node N1, which resides in the first shunt leg and between the switch module SM5 and the switch module SM6. The first drive signal is controlled by control signals S5 and S6. For the second drive current, a second drive signal for terminal T2 is generated at a second node N2, which resides in the second shunt leg and between the switch module SM7 and the switch module SM8. The second drive signal is controlled by control signals S7 and S8. For the third drive current, a third drive signal for terminal T3 is generated at a third node N3, which resides in the third shunt leg and between the switch module SM9 and the switch module SM10. The third drive signal is controlled by control signals S9 and S10.

Generation of the third drive current using the third drive signal is described in detail in association with FIGS. 10A through 10D. Notably, each drive signal is effectively a pulse width modulated signal that is filtered by the internal or external inductance associated with the motor M2 to provide a sinusoidal drive current having a desired frequency and amplitude. To generate the positive half-cycle of the sinusoidal drive current, control signal S9 provides a pulse width modulated signal to the gate of MOSFET Q9 throughout the positive half-cycle, and a control signal S10 is provided to the gate of the MOSFET Q10 to bias MOSFET Q10 off. Providing the pulse width modulated signal to the gate of MOSFET Q9 effectively generates a pulse width modulated signal at node N3 that switches between the positive rail voltage V+ and the negative rail voltage V−. In general, MOSFET Q9 is turned on when the pulse width modulated signal at node N3 is positive and turned off when the pulse width modulated signal at N3 is negative.

Figure 10A:
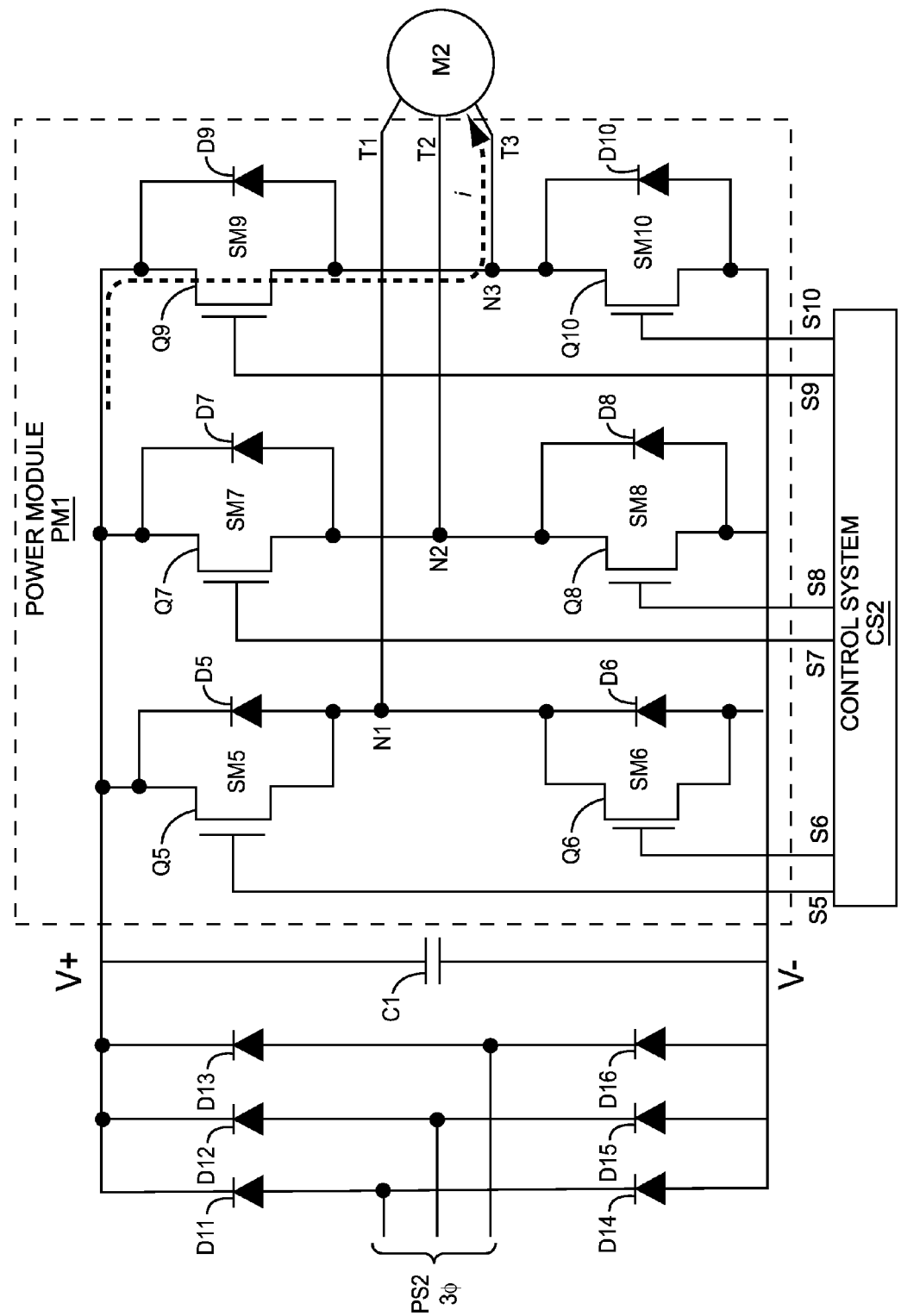
FIGS. 10A-10D illustrate generation of a drive current according to one embodiment of the present disclosure.
Figure 10B:
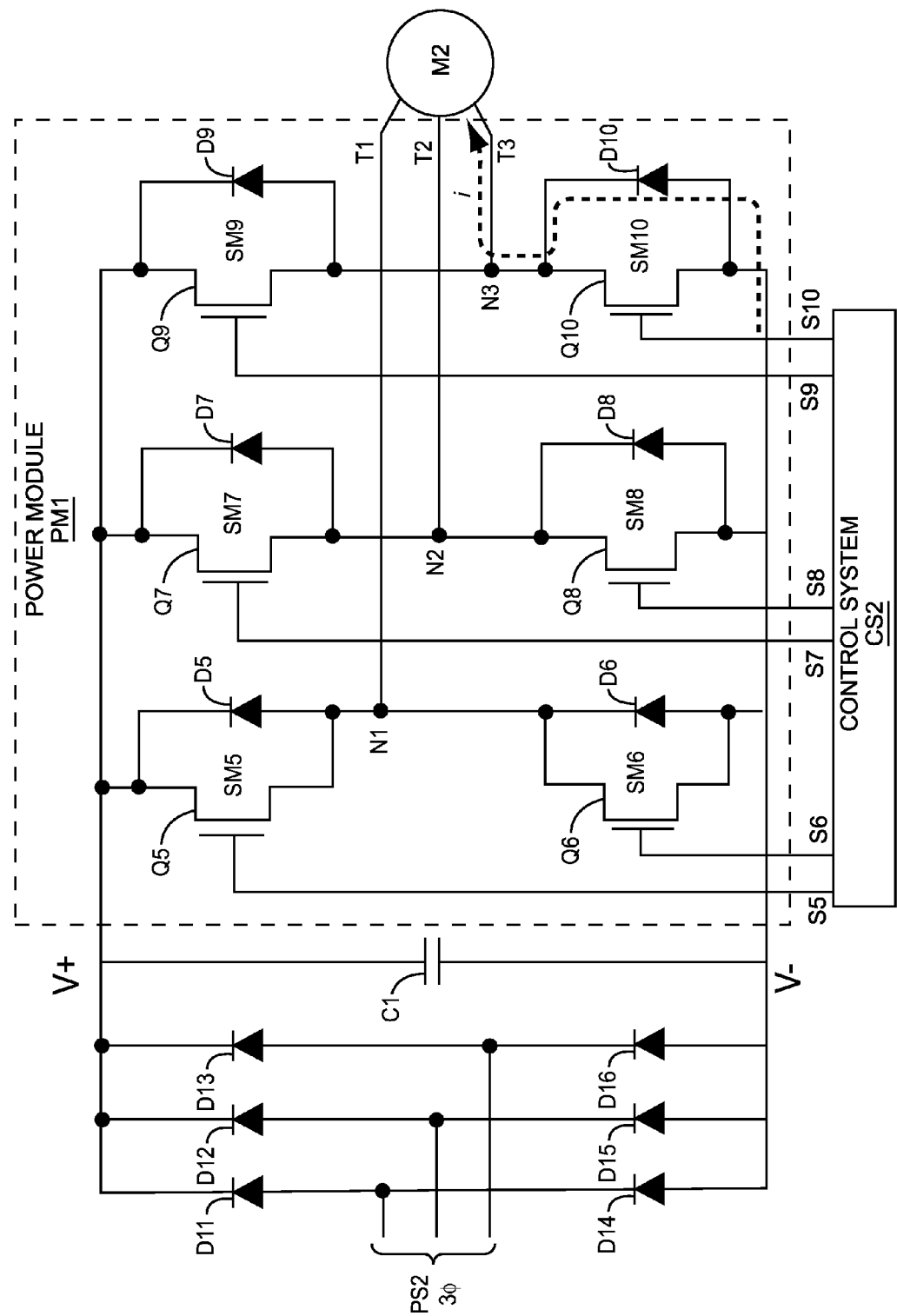

As shown in FIG. 10A, when the pulse width modulated signal at node N3 is positive, drive current i will flow through MOSFET Q9 of switch module SM9 and to terminal T3 of motor M2 through the inductance associated with the motor M2. The inductance associate with the motor M2 will tend to force the drive current i to continue to flow into terminal T3 even as the pulse width module signal at node N3 goes negative and MOSFET Q9 is turned off. As illustrated in FIG. 10B, the drive current i switches from flowing through MOSFET Q9 of switch module SM9 to flowing through a now forward biased diode D10 of switch module SM10 to terminal T3 of the motor M2. When the pulse width modulated signal at node N3 goes positive again, MOSFET Q9 will be turned back on and the drive current i will switch back to flowing through MOSFET Q9 of switch module SM9 and to terminal T3 of motor M2, as provided in FIG. 10A. This process will continue for several cycles throughout the positive half-cycle of the drive current i. The period or duty cycle of the pulse width modulated control signal S9 is varied throughout the positive half-cycle to provide the sinusoidal nature of the drive current i.

To generate the negative half-cycle of the sinusoidal drive current, control signal S10 provides a pulse width modulated signal to the gate of MOSFET Q10 throughout the negative half-cycle, and a control signal S9 is provided to the gate of the MOSFET Q9 to bias MOSFET Q9 off. Providing the pulse width modulated signal to the gate of MOSFET Q10 effectively generates a pulse width modulated signal at node N3 that switches between the positive rail voltage V+ and the negative rail voltage V−. In general, MOSFET Q10 is turned on when the pulse width modulated signal at node N3 is negative and turned off when the pulse width modulated signal at N3 is positive.

Figure 10C:
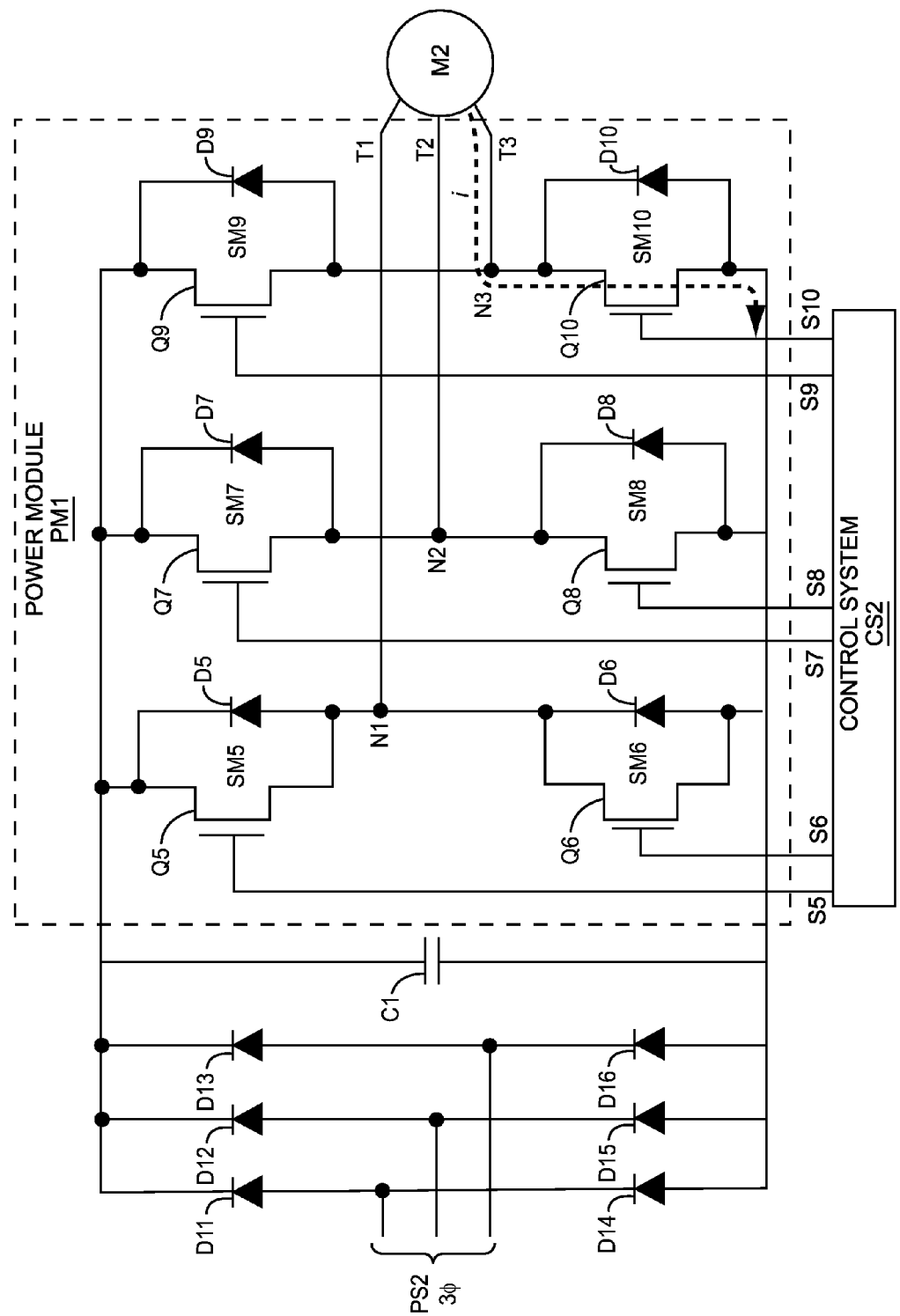
Figure 10D:
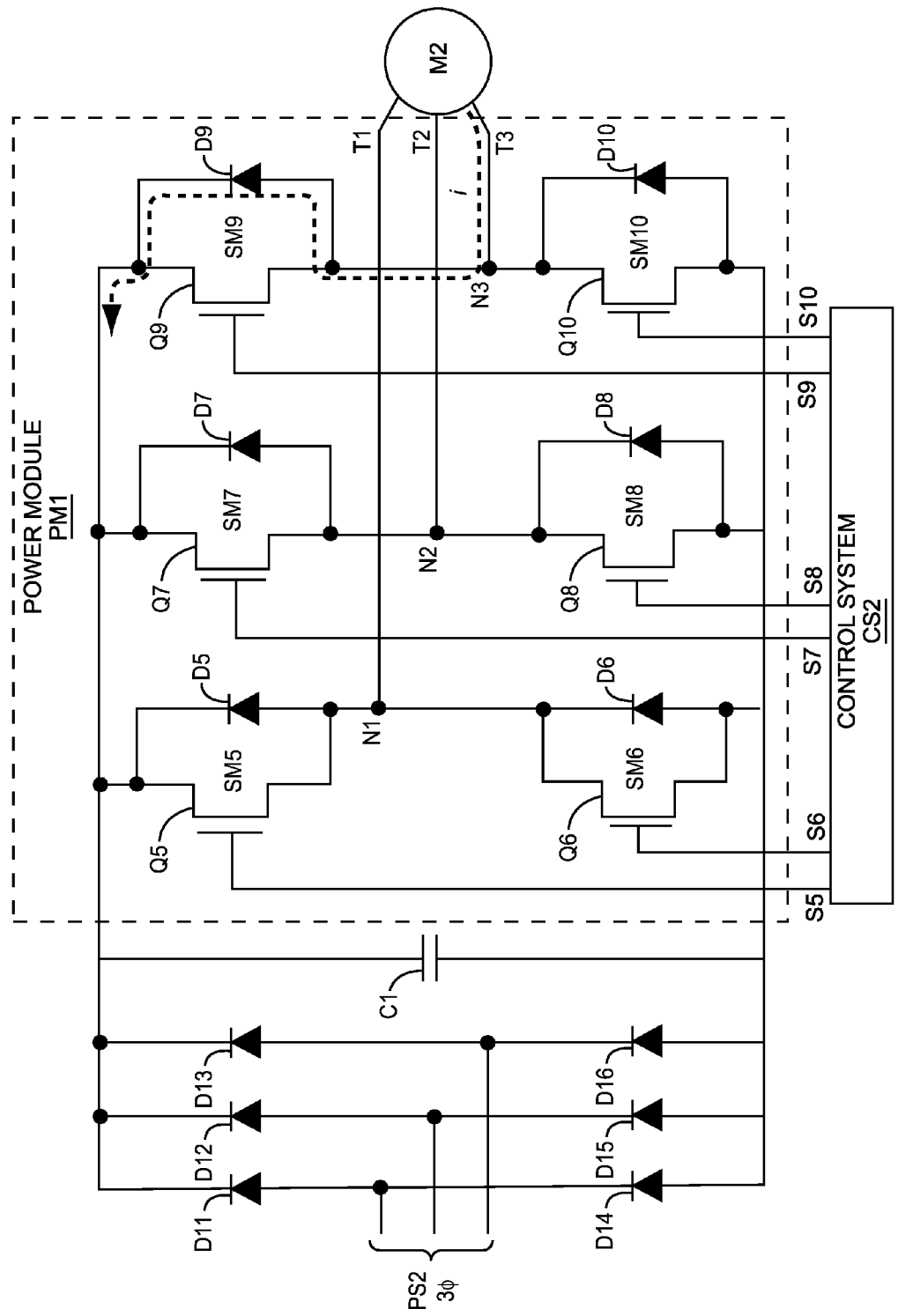

As shown in FIG. 10C, when the pulse width modulated signal at node N3 is negative, drive current i will flow through MOSFET Q10 of switch module SM10 from terminal T3 of motor M2 through the inductance associated with the motor M2. The inductance associate with the motor M2 will tend to force the drive current i to continue to flow from terminal T3 even as the pulse width module signal at node N3 goes positive and MOSFET Q10 is turned off. As illustrated in FIG. 10D, the drive current i switches from flowing through MOSFET Q10 of switch module SM10 to flowing through a now forward biased diode D9 of switch module SM9 from terminal T3 of the motor M2. When the pulse width modulated signal at node N3 goes negative again, MOSFET Q10 will be turned back on and the drive current i will switch back to flowing through MOSFET Q10 of switch module SM10 from terminal T3 of motor M2, as provided in FIG. 10C. This process will continue for several cycles throughout the negative half-cycle of the drive current i. The period or duty cycle of the pulse width modulated control signal S10 is varied throughout the positive half-cycle to provide the sinusoidal nature of the drive current i.

Modules configured like the power module PM1 of FIG. 7 are often referred to as "six-pack" modules because there are six switches in the overall power module. The current state-of-the-art for six-pack modules employs silicon (Si)-based IGBTs and PiN diodes, which are both minority carrier devices. Applicants believe the use of minority carrier or Si-based devices significantly limit both the performance and overall cost effectiveness of these six-pack modules for a variety of reasons. Further, applicants have discovered that the use of majority carrier devices that are fabricated from a wide bandgap material system, such as SiC or GaN, offer tremendous performance increases over the state-of-the-art six-pack modules.

Six-pack modules that use Si-based, minority carrier transistors and diodes are limited in switching (or operating) frequency, have high switching and overall power losses, generally require soft switching, and suffer from second breakdown at higher operating currents. However, a six-pack module that uses majority carrier transistors and diodes that are formed from a wide bandgap material system significantly improves upon each of these limitations. With regard to switching frequency, minority carrier devices require the removal of residual carriers during each commutation, or switching event. Removal of these residual carriers takes time, which injects a delay in switching and translates into relatively lower switching frequencies. Majority carrier devices do not suffer from this limitation, as there are generally no residual carriers to remove during commutation. In addition to relatively higher switching frequencies being possible, the lack of residual carriers also translates to more efficient switching, and thus, much lower switching and lower overall power losses. Further, the switching losses for majority carrier-based modules generally do not vary with temperature, unlike the switching losses for minority carrier-based modules.

A six-pack module that uses majority carrier transistors and diodes also allows for hard-switching as opposed to the soft-switching, which is required for modules employing minority carrier transistors and diodes. Hard switching refers to the case where devices are allowed to turn on or off when there is an appreciable amount of voltage and current present during the commutation. Soft switching refers to the case where there is little or no voltage and current present during commutation. To ensure that soft switching occurs, additional circuitry is generally required. Thus, a six-pack module that employs majority carrier transistors and diodes can handle hard switching without requiring additional circuitry required by a module that employs minority carrier transistors and diodes.

Accordingly, a first embodiment of the disclosure provides for a six-pack power module, such as power module PM1, or other type of power module that employs majority carrier transistors and diodes. Majority carrier transistors generally include field effect transistors (FETs), such as MOSFETs, HEMTs, JFETs, and the like, but will not include thyristors, bipolar transistors, and IGBTs. Majority carrier diodes generally include Schottky diodes, such as a junction barrier Shottky (JBS) diode. For the description herein and the claims that follow, reference to a particular "transistor" or "diode" may refer to a singular transistor or diode or an array of effectively parallel transistors or diodes, as illustrated in FIG. 4.

In a second embodiment, the transistors and diodes for the power module are formed from a wide bandgap material system, such as SiC or GaN. For the purposes herein, a wide bandgap material system is one that provides bandgaps greater than or equal to 3.0 electron-volts (eV). SiC has a bandgap of approximately 3.3 eV, and GaN has a bandgap of approximately 3.4 eV. For reference, Si has a bandgap of approximately 1.1 eV, and GaAs has a bandgap of approximately 1.4 eV, wherein both Si and GaAs are not considered wide bandgap material systems for the purposes of this disclosure. Notably, the transistors and diodes may be formed from different material systems. For example, the transistors may be GaN-based HEMTs and the diodes may be SiC-based JBS diodes.

In a third embodiment, the transistors and diodes for the power module are majority carrier devices and are both formed from a wide bandgap material system. A particularly effective combination has proven to be a SiC MOSFET with a SiC Schottky diode, such as a JBS diode. As such, the power module PM1 of FIG. 7 would have SiC MOSFETS for MOSFETs Q5-Q10 and SiC JBS diodes for diodes D5-D10, wherein each of these devices may be implemented in an array as opposed to in a single device. The MOSFETs may be replaced with other types of FETs and traditional Schottky (non JBS) diodes may be used in place of the JBS diodes.

Compared with a state-of-the-art six-pack module that employs Si IGBTs and PiN diodes and is rated at 1200V and 50 A, a six-pack power module PM1 that employs a SiC MOSFETs and JBS diodes offers significantly lower switching losses and can operate at much higher switching frequencies. For a first example, a six-pack module rated at 1200V and 50 A can have switching losses of less than 10 milli-Joules (mJ) for any temperature between −40 C and 150 C, while maintaining a low on-state voltage drop.

Figures 11, 12:
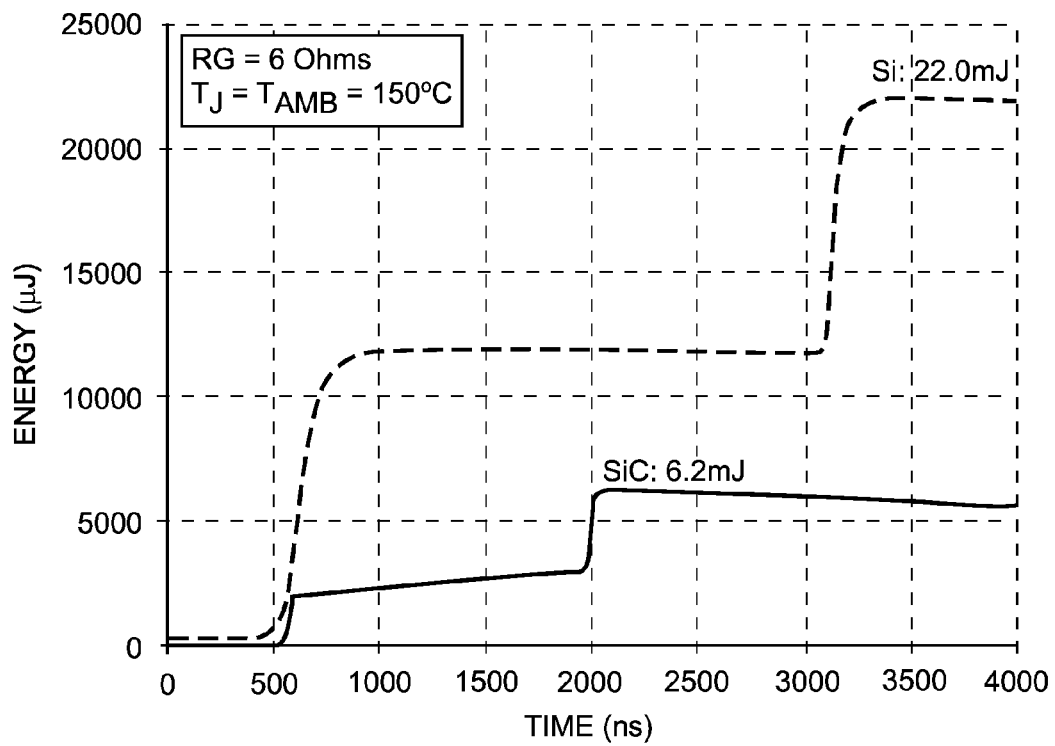
FIG. 11 is a graph comparing switching losses using existing power modules and the power modules of the present disclosure.
FIG. 12 is a block diagram of the internal structure of a power module according to one embodiment of the present disclosure.

FIG. 11 provides a graph that illustrates a 72% reduction in switching losses when transitioning from a power module that employs Si IGBTs and PiN diodes to one that employs SiC MOSFETs and JBS diodes when blocking 800V and conducting 100 A. From the graph, the Si-based power module has switching losses of 22.0 mJ while the SiC-based power module has switching losses of only 6.2 milli-Joules. Further, the use of SiC MOSFETs and JBS diodes allows for much higher switching frequencies than a power module employing Si IGBTs and PiN diodes.

The following compares a state-of-the-art 1200V/50 A Si-based six-pack module that employs IGBT and PiN diodes to a 1200V/50 A SiC-based six-pack module to demonstrate tremendous increase in switching frequency that the SiC-based module exhibits over the state-of-the-art Si-based module.

For this example, assume the modules are used in a three-phase inverter circuit topology. Both modules (the Si-based IGBT/PiN diode and the SiC-based MOSFET/JBS diode) were cooled using state-of-the-art liquid cooling methods. The key characteristics of the three-phase inverter circuit used for this study are defined in Table A.

TABLE A

Nominal Operating Conditions

| | |
|---|---|
| Output Frequency, fout | 60.0 Hz |
| Bus Voltage, Vbus | 675 Volts |
| Rated Output Voltage, VLL | 400 Vrms |
| Rated Current, Iphase | 33.0 Arms |
| Power Factor, PF | 1 |
| Rated Power, Pw | 22.9 kW |

A summary of the simulation results is shown in Table B below. The analysis shows that for this application, a state of the art 1200V/50 A Si-based module can only reach a maximum switching frequency of 30 kHz before it reaches its maximum junction temperature of 150 C. The SiC-based module, however, it is able to reach 390 kHz (about 13 times higher) for a similar junction temperature.

TABLE B

| | Si-based Power Module | SiC-based Power Module |
|---|---|---|
| Module Rated Current (A) | 50 | 50 |
| Switching Frequency (kHz) | 30 | 390 |
| Transistor Switching Loss (W) | 92.5 | 123.1 |
| Diode Switching Loss (W) | 52.2 | 0.0 |
| Transistor Conduction Loss (W) | 25.1 | 24.3 |
| Diode Conduction Loss (W) | 2.3 | 0.5 |
| Junction Temp (@Fluid = 60° C.) | 149.0 | 148.8 |
| Total System Loss (W) | 1032.8 | 887.3 |

In practice, the SiC-based modules can achieve switching frequencies before reaching maximum junction temperatures (150 C) greater than 50 kHz, 75 kHz, 125 kHz, and even 200 kHz with blocking voltage ratings above 550V and forward current ratings above 45 amps when operating at voltage and current levels of at least half of their rated levels. For example, a 1200V/50 A SiC-based module can operate at switching frequencies greater than 50 kHz, 75 kHz, 125 kHz, and even 200 kHz.

The concepts of the present disclosure also allow greater power densities than possible with Si-based power modules. Power density (PD) is determined herein by the following equation: $PD=((V_b*I_c)/A_h)/SM_\#$, wherein $V_b$ is the rated reverse blocking voltage, $I_c$ is the rated conducting current, $A_h$ is the total interior area of the housing, and $SM_\#$ is the number of switch modules SMx provided by the power module. For example, a 1200V, 50 A power module PM1 in a six-pack configuration and mounted in housing having an interior area of 29.63 cm$^2$ would result in a PD of 337.7 watts/cm$^2$, where $V_b$ is 1200V, $I_c$ is 50 A, $A_h$ is 29.64 cm$^2$, and $SM_\#$ is 6. While Si-based power modules are approaching their power density limits at these ratings and in this size of housing, the power modules of the present disclosure are capable of achieving much greater power densities. For example, the power modules of the present disclosure are capable of achieving power densities equal to and greater than 400 watts/cm$^2$, 425 watts/cm$^2$, 450 watts/cm$^2$, 475 watts/cm$^2$, and 500 watts/cm$^2$.

With reference to FIG. 12, an exemplary internal structure is provided for the power module PM1. This structure will reside within the interior opening of the housings H1 or H2. Starting at the bottom, a base plate L0 formed from copper, aluminum silicon carbide (AlSiC), or the like, acts as a foundation on which a substrate L3 is attached. The substrate L3 may be formed from aluminum nitride (AlN), aluminum oxide (AlO), silicon nitride (SiN), or the like, and have metal traces formed on the bottom and top thereof from respective bottom and top trace layers L2 and L4. The bottom and top trace layers L2 and L4 may be copper, or the like. The substrate L3 may be attached to the base plate L0 by soldering the bottom traces that are formed from the bottom trace layer L2 to the base plate L0. The solder is represented by the solder layer L1.

The transistors and diodes for the power module PM1 are formed on a die that is represented by the device layers L8. The device layers L8 may have one or more metal layers on the top and bottom from which traces and contacts are formed. In the illustrated example, the bottom traces and contacts are formed from a multi-layer back metal structure including first and second back metal layers L7 and L6. The second back metal layer L6 may be silver (Ag), or the like. The first back metal layer L7 may be nickel (Ni) or the like. The top traces and contacts may be formed from aluminum (Al), and the like and are represented by the top metal layer L9. The device layers L8 may be soldered to the substrate L3 by soldering portions of the second back metal layer L6 to the top trace layer L4. The solder is represented by the solder layer L5.

Notably, use of AlN for the substrate L3 has shown to provide much higher thermal conductivity than conventional alumina or silicon nitride (SiN) substrates. Given the relatively low electrical resistance associated with SiC devices and the low thermal resistance of AlN substrates L3, such power modules can handle higher currents than conventional power modules. The thickness of the substrate L3 may be selected based on the targeted isolation voltage. With the increased power handling capabilities of the power modules of the present disclosure, either power modules of the same size can handler greater power, or the size of the power modules may be reduced while handling the same power.

The following description outlines several transistor configurations that can be used in the power modules described above as MOSFETs $Q1_N$-$Q10_N$ or alternatives thereto. Other transistor configurations may be employed. Some embodiments of the disclosure provide silicon carbide (SiC) insulated gate devices that are suitable for high power and/or high temperature applications.

Figure 13:
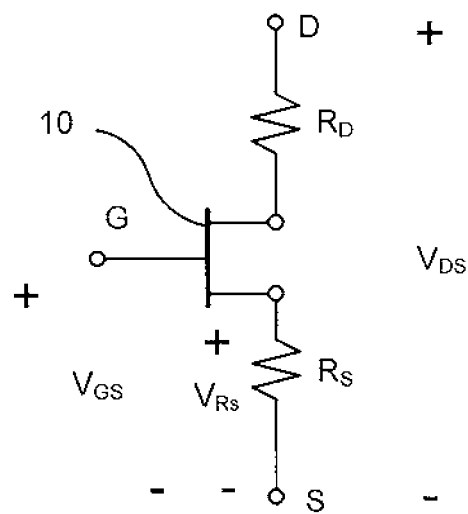
FIG. 13 is a circuit diagram of a metal-oxide-semiconductor field effect (MOSFET) device.

FIG. 13 is a circuit diagram of a metal oxide semiconductor field effect transistor (MOSFET) device 10. As shown therein, a MOSFET device generally includes three terminals, namely, a drain terminal (D), a source terminal (S) and a gate terminal (G). The gate-to-source voltage of the device is denoted $V_{GS}$, while the drain-to-source voltage of the device is denoted $V_{DS}$. The device has a built in source resistance $R_S$ and a built-in drain resistance $R_D$ based on the physical characteristics of the device. The voltage over the built-in source resistance $R_S$ is denoted $V_{Rs}$.

In a MOSFET device, current passing through a channel of the device from the drain to the source is regulated by applying a voltage to the gate. The gate is insulated from the channel by a gate insulator, such as silicon dioxide. As the voltage on the gate terminal is increased, current passing through the device may increase.

Figure 14:
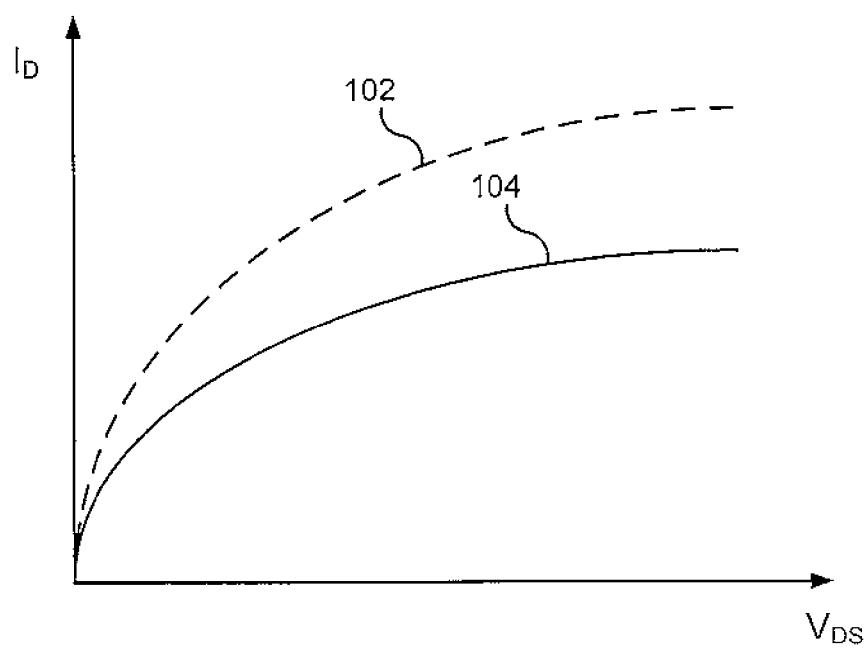
FIG. 14 is a graph illustrating hypothetical on-state current-voltage characteristics for a MOSFET device.

FIG. 14 is a graph illustrating hypothetical (curve 102) and actual (104) on-state current-voltage characteristics for a MOSFET device for a given gate-to-source voltage ($V_{GS}$). As shown in FIG. 14, for a given gate voltage, the current through the device ($I_D$) increases as the voltage between the drain and source ($V_{DS}$) increases, up to a saturation point. In actual devices, the actual saturation current of a transistor is typically less than the ideal saturation current. Part of the reason for this relates to the source resistance of the device.

Figure 15:
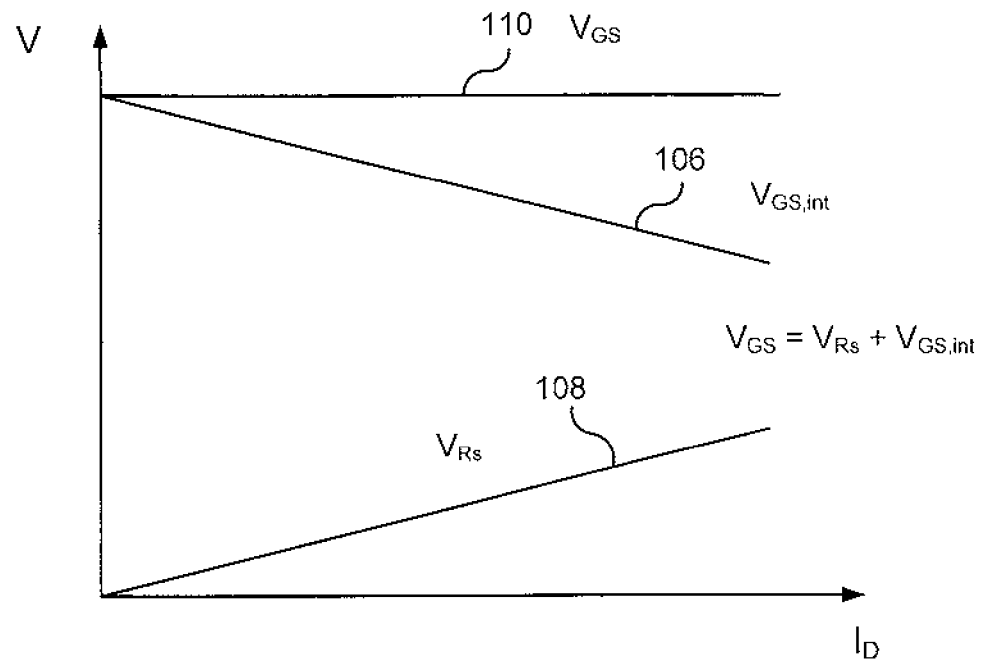
FIG. 15 is a graph illustrating the effect of source resistance on gate voltage.

In particular, as the drain current $I_D$ passing through the device increases, the amount of voltage dropped over the source resistance $R_S$ increases in direct proportion. FIG. 15 is a graph illustrating the effect of source resistance on gate voltage. In FIG. 15, the voltage from the gate terminal to the source terminal is denoted $V_{GS}$. A portion of the gate voltage $V_{GS}$ applied to the device across the gate and source terminals is dropped over the internal source resistance $R_S$ of the device. That portion of the gate voltage is denoted $V_{Rs}$ in FIG. 15. The remainder of the gate-to-source voltage appears as a voltage across the gate insulator, denoted $V_{GS,int}$ in FIG. 15. Thus, $V_{GS}$ is equal to the SUM of $V_{Rs}$ and $V_{GS,int}$.

As shown in FIG. 15, the gate-to-source voltage may remain constant as the drain current increases. However, the portion of the gate voltage $V_{GS}$ that is dropped over the internal source resistance of the device, $V_{Rs}$ increases as the drain current $I_D$ increases, while the portion of the gate-to-source voltage that appears as a voltage across the gate insulator, $V_{GS,int}$, decreases as the drain current $I_D$ increases.

Thus, as the drain current increases the portion of the gate voltage that is being used to maintain the channel decreases, which may cause the device to go into saturation at a lower level of drain-to-source voltage. Accordingly, a high source resistance can adversely affect the operation of a MOSFET or other insulated gate controlled device.

Figure 16:
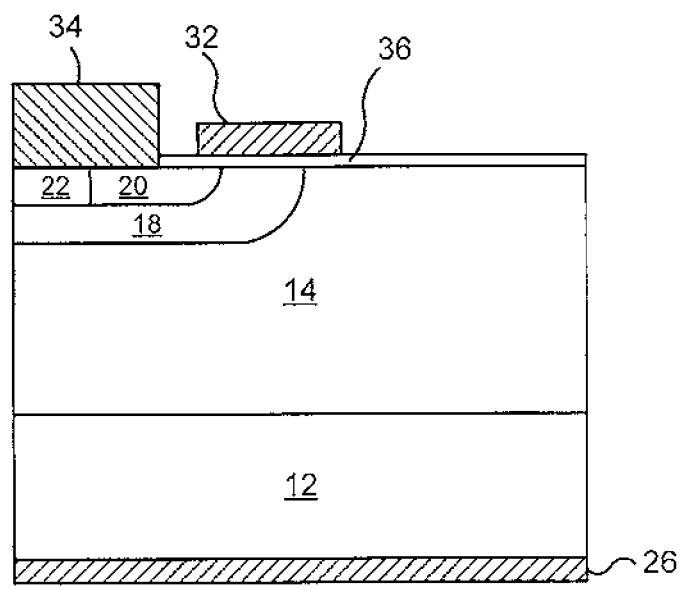
FIG. 16 is a partial cross sectional illustration of cell of a conventional power MOSFET device.

A unit cell 10 of a MOSFET structure according to some embodiments is shown in FIG. 16. The device 10 of FIG. 16 includes an n– drift epitaxial layer 14 on an n-type, 8° off-axis 4H-SiC substrate 12. The n– drift layer 14 may have a thickness of about 100 µm to about 120 µm, and may be doped with n-type dopants at a doping concentration of about $2 \times 10^{14}$ cm$^{-3}$ to about $6 \times 10^{14}$ cm$^{-3}$ for a blocking capability of about 10 kV. Other doping concentrations/voltage blocking ranges are also possible. For a 1200V MOSFET device, the substrate may be 4° off-axis 4H-SiC and the drift layer may have a thickness of about 10 µm and may be doped with n-type dopants at a doping concentration of about $6 \times 10^{15}$ cm$^{-3}$.

The structure further includes a p+ well region 18 and an n+ source region 20 that may be formed by selective implantation of, for example, aluminum and nitrogen, respectively. The junction depth of the p+ well region 18 may be about 0.5 µm, although other depths are possible. The structure 10 further includes a p+ contact region 22 that extends from a surface of the drift layer 14 into the p+ well region 18. A junction termination (not shown) may be provided around the device periphery.

All of the implanted dopants may be activated by annealing the structure at a temperature of about 1600° C. with a silicon over pressure and/or covered by an encapsulation layer such as a graphite film. A high temperature anneal may damage the surface of the silicon carbide epitaxy without these conditions. The silicon overpressure may be provided by the presence of silane, or the close proximity of silicon carbide coated objects that provide a certain amount of silicon overpressure. Alternatively or in combination with silicon overpressure, a graphite coating may be formed on the surface of the device. Prior to annealing the device to activate the implanted ions, a graphite coating may be applied to the top/front side of the structure in order to protect the surface of the structure during the anneal. The graphite coating may be applied by a conventional resist coating method and may have a thickness of about 1 µm. The graphite coating may be heated to form a crystalline coating on the drift layer 14. The implanted ions may be activated by a thermal anneal that may be performed, for example, in an inert gas at a temperature of about 1600° C. or greater. In particular the thermal anneal may be performed at a temperature of about 1600° C. in argon for 5 minutes. The graphite coating may help to protect the surface of the drift layer 14 during the high temperature anneal.

The graphite coating may then be removed, for example, by ashing and thermal oxidation.

After implant annealing, a field oxide of silicon dioxide (not shown) having a thickness of about 1 µm may be deposited and patterned to expose the active region of the device.

A gate oxide layer 36 may be formed by a gate oxidation process, with a final gate oxide thickness of 400-600 Å.

In particular, the gate oxide may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour. The wet $O_2$ oxide anneal may be performed at a temperature of about 950° C. or less for a time of at least about 1 hour. The temperature of the wet $O_2$ anneal may be limited to discourage further thermal oxide growth at the SiC/SiO$_2$ interface, which may introduce additional interface states. In particular, the wet $O_2$ anneal may be performed in wet $O_2$ at a temperature of about 950° C. for about 3 hours. The resulting gate oxide layer may have a thickness of about 500 Å.

In some embodiments, the dry $O_2$ oxide growth may be performed at a temperature of about 1175° C. in dry $O_2$ for about 4 hours. The resulting oxide layer may be annealed at a temperature of up to about 1175° C. in an inert atmosphere. In particular, the resulting oxide layer may be annealed at a temperature of about 1175° C. in Ar for about a time duration ranging from 30 min to 2 hours. Then the oxide layer receives an anneal in NO ambient at a temperature ranging from 1175° C. to 1300C, for a duration ranging from 30 minutes to 3 hours. The resulting gate oxide layer may have a thickness of about 500 Å.

After formation of the gate oxide 36, a polysilicon gate 32 may be deposited and doped, for example, with boron followed by a metallization process to reduce the gate resistance. Al/Ni contacts may be deposited as the p-type ohmic source contact metal 28, and Ni as the n-type drain contact metal 26. All contacts may be sintered in a Rapid Thermal Annealer (RTA), and thick Ti/Au layers may be used for pad metals.

Referring to FIG. 16, the source resistance of a MOSFET device has two primary components, namely, the contact resistance $R_C$ between the source ohmic contact 34 and the source region 20, and the sheet resistance $R_{sheet}$ in the source region 20 between the source ohmic contact 34 and the channel. Thus, $R_S=R_C+R_{sheet}$. In a conventional silicon-based MOSFET device, the sheet resistance $R_{sheet}$ is the dominant factor in determining the source resistance, because it is possible to form very low resistivity ohmic contacts to silicon and other narrow-bandgap semiconductors. However, in wide bandgap semiconductors (i.e., semiconductors having a bandgap greater than about 2.0 V), including compound semiconductor materials, such as silicon carbide and gallium nitride, diamond, and ZnO, the contact resistance $R_C$ may be the dominant contributor to the source resistance. In particular, it is difficult to form very low resistivity ohmic contacts to silicon carbide and other wide bandgap materials because of the high energy barrier associated with such materials.

Figure 17:
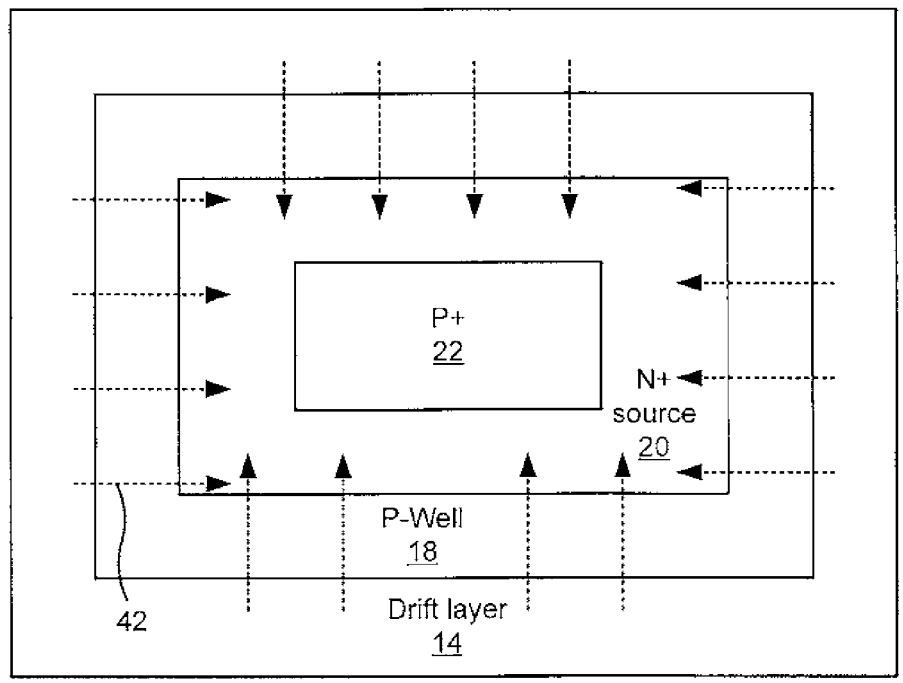
FIGS. 17 and 18 are plan views illustrating layouts of conventional power MOSFET devices.
Figure 18:
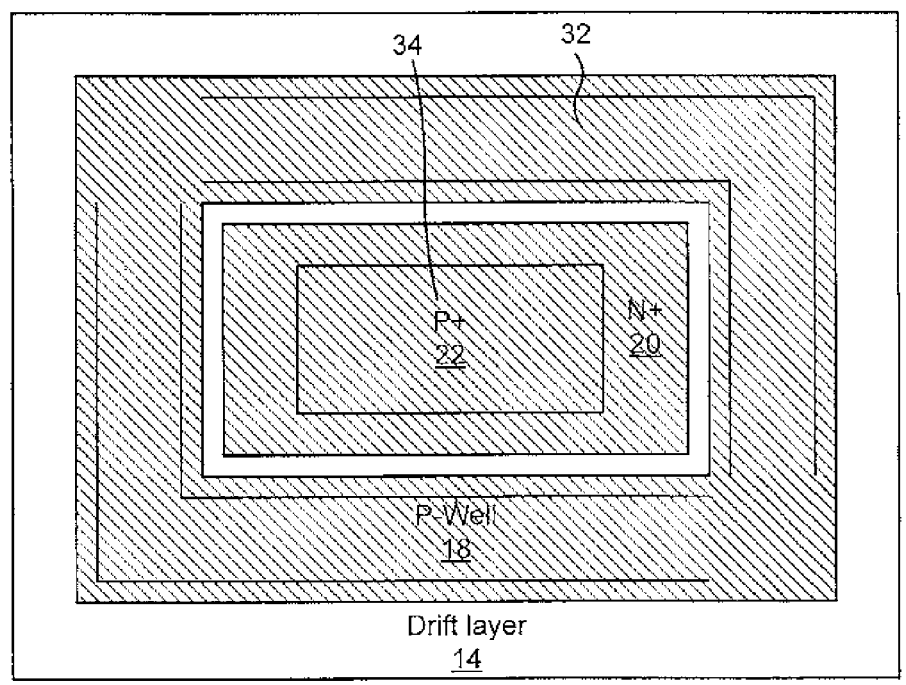

FIGS. 17 and 18 are plan views illustrating layouts of conventional power MOSFET devices. In a conventional power MOSFET device, the layout is designed to reduce or minimize sheet resistance under the assumption that contact resistance is less important than sheet resistance. Thus, referring to FIG. 17, a conventional power MOSFET device typically includes a p-well 18 formed in a drift layer 14, an n+ source region 20 in the p-well 18, and a p+ contact region 22 in the n+ source region 20. Referring to FIG. 18, a source contact 34 is formed on the n+ source region 20 and the p+ contact region 22. A gate 32 is formed over the p-well 18 and overlaps the periphery of the n+ source region 20 and adjacent portions of the drift layer 14. Current flow from the drain to the source is indicated by the arrows 42 in FIG. 17.

As noted above, in a wide bandgap semiconductor material system, the source resistance may be more affected by the contact resistance of the source ohmic contact than by the sheet resistance of the source layer. Accordingly, to decrease the source resistance of a wide bandgap power semiconductor device, it may be desirable to decrease the contact resistance of the source ohmic contact. In general, contact resistance can be decreased by increasing the minimum dimension of the contact, which is the smallest dimension of the contact in any direction. However, simply increasing the minimum dimension of the source ohmic contact of an electronic device can undesirably increase the cell to cell spacing, or pitch, of the device. The pitch of a MOSFET device may be proportional to the width of the p-well region of the device. Increasing the pitch of the device reduces the density of the devices that can be formed on a single substrate, reducing the devices yielded and increasing manufacturing costs.

According to some embodiments, an insulated gate device layout is provided that increases the minimum dimension of the source ohmic contact without increasing the pitch of the device and/or the width of the p-well region of the device. A device layout according to some embodiments may increase the sheet resistance of the device. Such an effect may be highly undesirable in a device based on a narrow bandgap semiconductor material. However, since sheet resistance is not the dominant factor in determining source resistance of a wide bandgap device, such a tradeoff may be acceptable for wide bandgap devices. In devices according to some embodiments, a ratio of the source sheet resistance to the source contact resistance may be greater than 0.75 (i.e. $R_{sheet}/R_C>0.75$). In some embodiments, the device may have a source contact resistance that is less than the source sheet resistance. That is, in some embodiments, the ratio of the source sheet resistance to the source contact resistance may be greater than 1 (i.e. $R_{sheet}/R_C>1$), and in further embodiments, the ratio of the source sheet resistance to the source contact resistance may be greater than 5.

Figure 19:
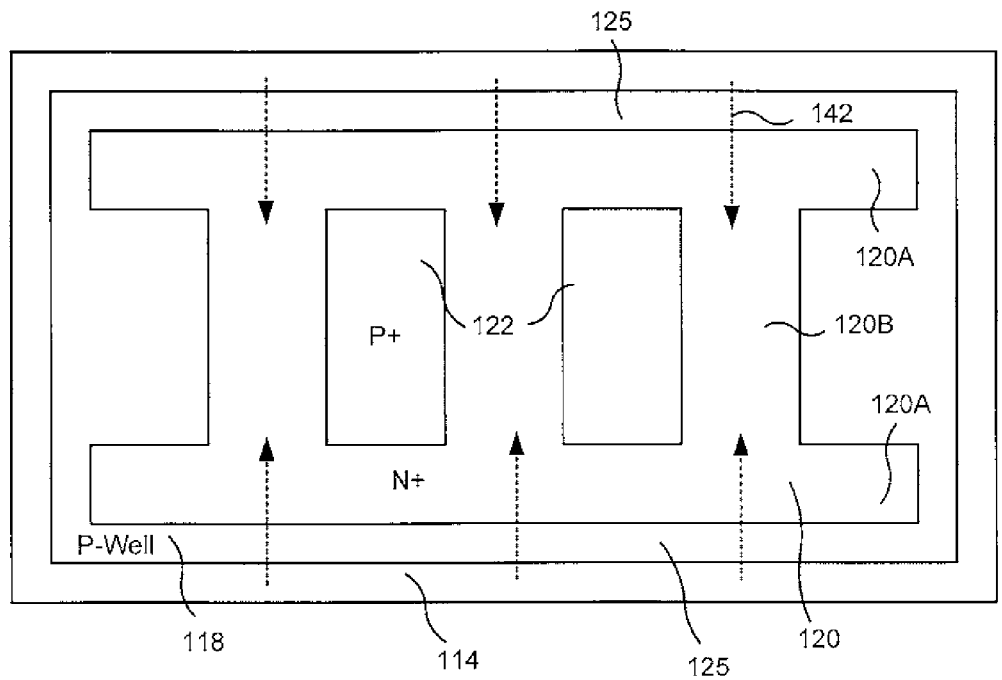
FIGS. 19 and 20 are plan views illustrating layouts of power MOSFET devices according to some embodiments.
Figure 20:
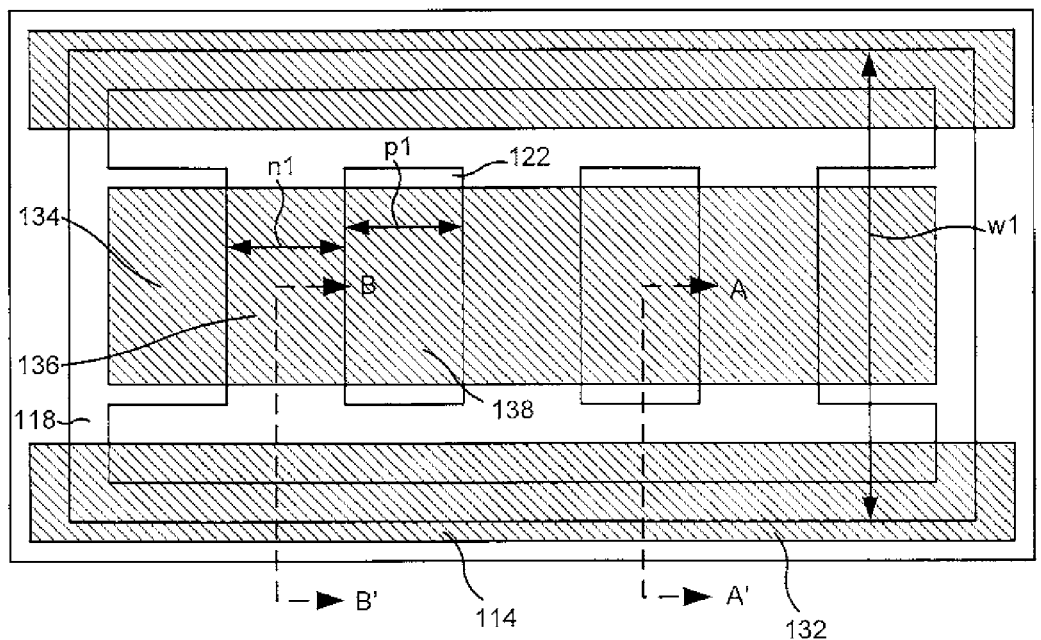
Figure 21:
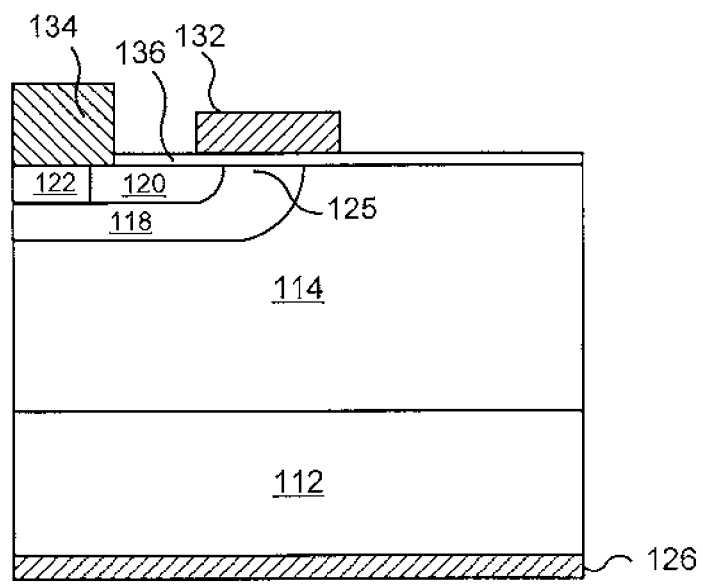
FIGS. 21 and 22 are partial cross sectional illustrations of a cell of a power MOSFET device according to some embodiments.
Figure 22:
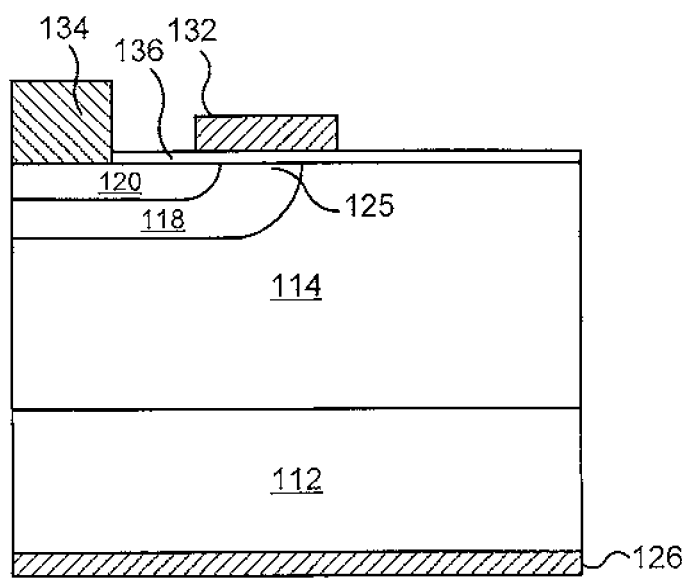

FIGS. 19 and 20 are plan views illustrating layouts of MOSFET device cells 100 according to some embodiments, and FIGS. 21 and 22 are partial cross sectional illustrations of a cell of a MOSFET device according to some embodiments. In particular, FIG. 21 is a cross section taken along line A-A' of FIG. 20, while FIG. 22 is a cross section taken along line B-B' of FIG. 20.

The device 100 shown in FIGS. 19-22 includes an n− drift epitaxial layer 114 on an n-type, 8° off-axis 4H-SiC substrate 112. The n− drift layer 114 may have a thickness of about 100 μm to about 120 μm, and may be doped with n-type dopants at a doping concentration of about $2\times10^{14}$ cm$^{-3}$ to about $6\times10^{14}$ cm$^{-3}$ for a blocking capability of about 10 kV. For a 1200V MOSFET device, the substrate may be 4° off-axis 4H-SiC and the drift layer may have a thickness of about 10 μm and may be doped with n-type dopants at a doping concentration of about $6\times10^{15}$ cm$^{-3}$.

The structure further includes a p+ well region 118 and an n+ source region 120 that may be formed by selective implantation of, for example, aluminum and nitrogen, respectively. The junction depth of the p+ well region 118 may be about 0.5 μm. The structure 100 further includes a plurality of p+ contact regions 122 that extend from a surface of the drift layer 114 into the p+ well region 118. A junction termination (not shown) may be provided around the device periphery.

Referring to FIG. 19, the n+ source region 120 includes a pair of lateral source regions 120A that are parallel to opposing channel regions 125 in the p-well 118. A plurality of source contact regions 120B extend between the lateral source regions 120A, and the plurality of p+ contact regions 122 are provided between the source contact regions 120B.

Referring to FIG. 20, gate contacts 132 are formed over the channel regions 125 and overlap the lateral source regions 120A. A source ohmic contact 134 is formed across the source contact regions 120B and the p+ contact regions 122. The source ohmic contact 134 overlaps the source contact regions 120B in a source contact region 136. The source ohmic contact 134 overlaps the p+ contact regions 122 in a body contact region 138.

The portion of the source contact regions 120B contacted by the source ohmic contact 134 may have a minimum dimension that is larger than the minimum dimension that can be obtained for a conventional layout such as the layout shown in FIGS. 17 and 18 for a similar pitch/p-well size. Accordingly, the source contact resistance may be reduced without substantially increasing the device pitch/p-well size. The "minimum dimension" of a feature refers to the smallest width of the feature in any cross section of the feature. For example, the minimum dimension p1 of the body contact region 138, the minimum dimension n1 of the n-type contact region 136 and the minimum dimension w1 of the p-well region 118 are shown in FIG. 20.

In a device having a layout as shown in FIGS. 19 and 20, current flow to the source contact flows through the source contact regions 120B, as indicated by the arrows 142 in FIG. 19. The source contact regions 120B may have an increased sheet resistance compared to the source region of a device having a conventional layout as shown in FIGS. 17 and 18. However, the increase in sheet resistance may be more than compensated by the decrease in contact resistance, thus providing an overall decrease in the source resistance of the device.

Figure 23:
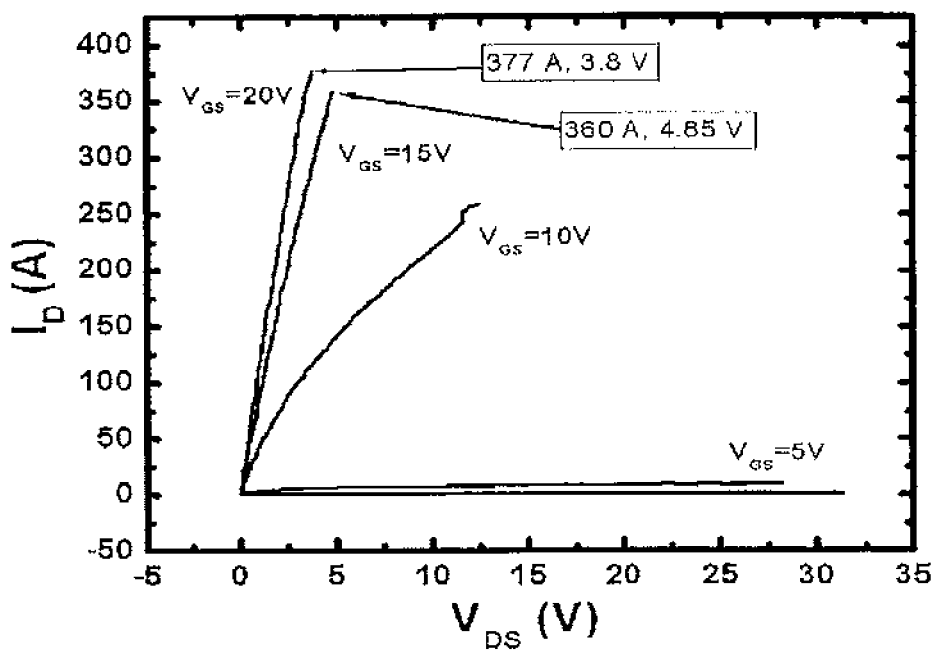
FIG. 23 is a graph on-state current-voltage characteristics for a MOSFET device according to some embodiments.

FIG. 23 is a graph of on-state current-voltage characteristics for a 7 mm×8 mm 1200 V silicon carbide MOSFET device according to some embodiments. In the device characteristics illustrated in FIG. 23, a drain current ($I_D$) of 377 A was measured at a forward voltage drain-to-source voltage ($V_{DS}$) of 3.8 V. The current density, normalized to the active area, was over 750 A/cm$^2$.

The on-resistance of a MOSFET device is affected by the drain resistance, the channel resistance and the source resistance of the device. Accordingly, reducing the source resistance of the device also reduces the on-resistance of the device.

A wide bandgap MOSFET device having a layout according to some embodiments may be capable of substantially increased saturation current due to the lower on-resistance of the device and the fact that increased current levels have less of a de-biasing effect on the gate. That is, because of the lower source resistance, less voltage will be developed over the source resistance as the drain current increases. Thus, more of the gate-to-source voltage is applied to the channel of the device.

Figure 24:
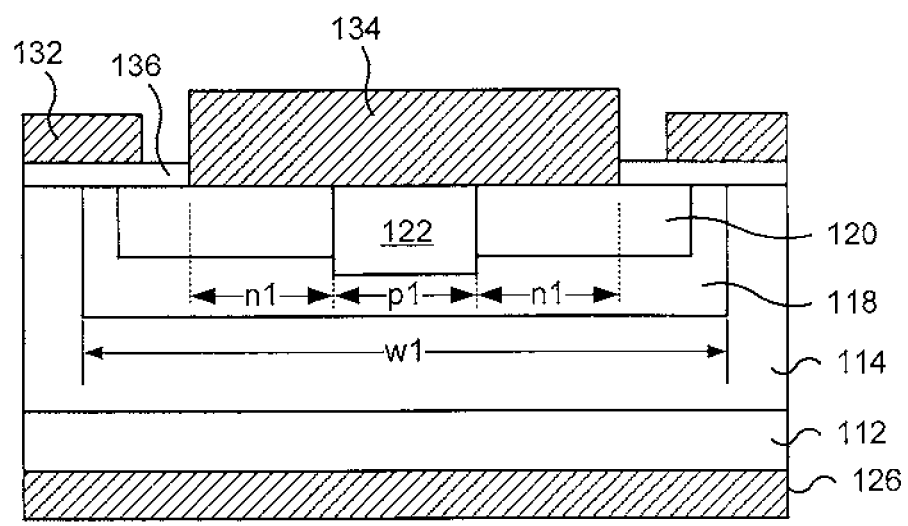
FIG. 24 is a cross sectional illustration of cell of a power MOSFET device according to some embodiments.

FIG. 24 is an idealized cross section of a device having a layout in accordance with some embodiments. In particular, FIG. 24 illustrates some dimensions of a device having a layout in accordance with some embodiments. For example, as shown in FIG. 24, the minimum dimension of the implanted cell area (i.e. the p-well 118) is denoted as width w1 in FIG. 24. It will be appreciated, however, that the minimum dimension of the p-well 118 may occur in a dimension that is different from the plane of the device illustrated in FIG. 24. For example, the minimum dimension of the p-well 118 may occur in a dimension that is perpendicular to the plane of the device illustrated in FIG. 24.

The minimum dimension of the n-type contact area is denoted as width n1 in FIG. 24, while the minimum dimension of the p-type contact area is denoted as width p1 in FIG. 24. The n-type contact area may be defined as the area of overlap between the source ohmic contact 134 and the n+ source region 120, while the p-type contact area may be defined as the area of overlap between the source ohmic contact 134 and the p+ contact regions 122.

Figure 25:
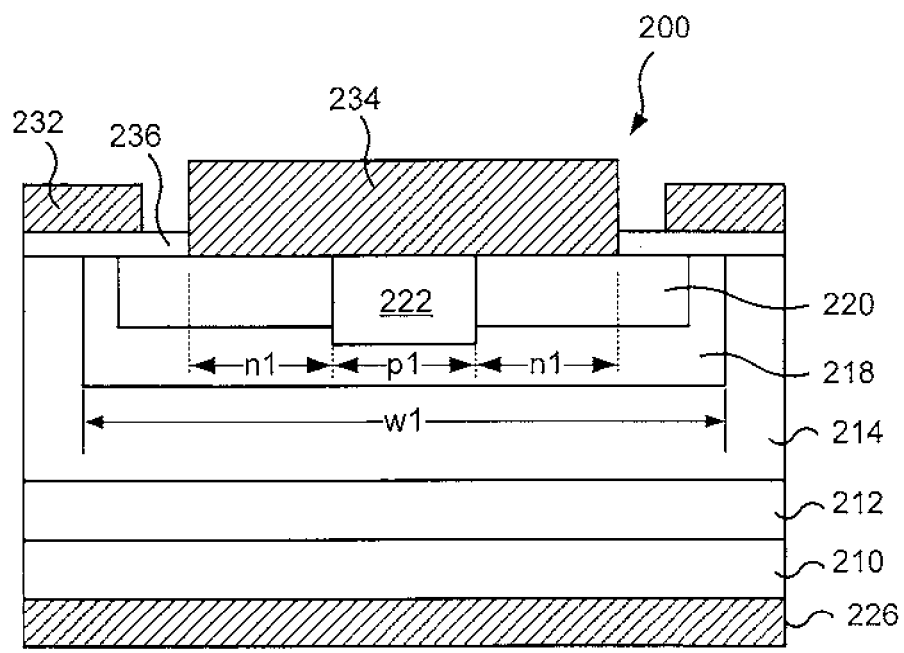
FIG. 25 is a cross sectional illustration of cell of an insulated gate bipolar transistor device according to some embodiments.

An insulated gate bipolar transistor (IGBT) device 200 according to some embodiments is illustrated in FIG. 25. As shown therein, the IGBT device includes an n− drift epitaxial layer 214 on a p-type epitaxial layer 212. The p-type epitaxial layer 212 is formed on a heavily doped p-type, 8° off-axis 4H-SiC substrate or layer 210. The n-drift layer 214 may have a thickness of about 100 μm to about 120 μm, and may be doped with p-type dopants at a doping concentration of about 2×10$^{14}$ cm$^{-3}$ to about 6×10$^{14}$ cm$^{-3}$ for a blocking capability of about 10 kV.

The IGBT structure 200 further includes a p+ well region 218 and an n+ source/emitter region 220 that may be formed by selective implantation of, for example, aluminum and nitrogen, respectively. The junction depth of the p+ well region 218 may be about 0.5 μm. The structure 200 further includes a plurality of p+ body contact regions 222 that extend from a surface of the drift layer 214 into the p+ well region 218. The conductivity types may be reversed in some embodiments.

A gate contact 232 is on a gate insulator 236, a source/emitter contact 234 is on the source contact regions 220 and the body contact regions 222. A collector contact 226 contacts the substrate 210.

According to some embodiments, a transistor device may have a ratio of n1 to w1 that is greater than 0.2. In further embodiments, a transistor device may have a ratio of n1 to w1 that is greater than about 0.3. In further embodiments, a transistor device may have a ratio of n1 to w1 that is in the range of about 0.2 to 1. In further embodiments, a transistor device may have a ratio of n1 to w1 that is in the range of about 0.3 to 1. In further embodiments, transistor device may have a ratio of n1 to w1 that is greater than 0.5. For example, the minimum dimension n1 of the n-type contact area of a device having a layout according to some embodiments may be about 2 μm for a device having a minimum dimension of the implanted cell area of 6 μm.

According to some embodiments, a transistor device may have a ratio of p1 to w1 that is greater than 0.2. In further embodiments, a transistor device may have a ratio of p1 to w1 that is greater than about 0.3. In further embodiments, a transistor device may have a ratio of p1 to w1 that is greater than about 0.5. In further embodiments, a transistor device may have a ratio of p1 to w1 that is in the range of about 0.2 to 0.5. In further embodiments, a transistor device may have a ratio of p1 to w1 that is in the range of about 0.2 to 1.

Some embodiments provide transistor devices having increased current densities. Current density is defined as the total current divided by the area of the chip. For example, a wide bandgap transistor device according to some embodiments may be capable of current densities in excess of 200 A/cm$^2$ and a blocking voltage of 1000 V or more. A wide bandgap transistor device according to further embodiments may be capable of a current of 100 A or greater at current densities in excess of 200 A/cm$^2$, a forward voltage drop of less than 5 V and a blocking voltage of 1000 V or more. A wide bandgap transistor device according to still further embodiments may be capable of a current of 100 A or greater at current densities in excess of 300 A/cm$^2$, a forward voltage drop of less than 5 V and a blocking voltage of 1000 V or more.

A semiconductor device according to some embodiments has a reverse blocking voltage in excess of 1000 volts and a current density greater than 200 amps per square centimeter at a current greater than 100 A.

A semiconductor device according to further embodiments has a reverse blocking voltage of 1000 volts or more and a forward current capability greater than 100 A at a forward voltage of 5 volts or less.

A metal-oxide semiconductor field effect transistor device according to some embodiments has a reverse blocking voltage of 1200 volts or more and a forward current capability greater than 100 A.

A metal-oxide semiconductor field effect transistor device according to some embodiments has a reverse blocking voltage of 1000 volts or more and a differential on-resistance less than 8 mOhms-cm$^2$.

A semiconductor device having a blocking voltage less than 1000 V and configured to pass forward current at a current density greater than 200 amps per square centimeter at a forward voltage drop of 5 V or less.

Some embodiments may enable wide bandgap transistor devices to achieve drain currents of 100 Amps or higher at a drain to source voltage that is less than 4 Volts in a device having a cell pitch of less than 20 μm. Some embodiments may enable wide bandgap transistor devices to achieve drain currents of 100 Amps or higher at a drain to source voltage that is less than 4 Volts in a device having a cell pitch of less than 10 μm. Some embodiments may enable wide bandgap transistor devices to achieve drain currents of 80 Amps or higher at a drain to source voltage that is less than 5 Volts in a device having a cell pitch of less than 10 μm.

An IGBT device according to some embodiments with a voltage blocking capability of 10 kV or greater may have a differential specific on-resistance of less than 14 mOhm-cm$^2$ with a forward voltage drop of 5.2 V or less at a current density of 100 A/cm$^2$.

Figure 26:
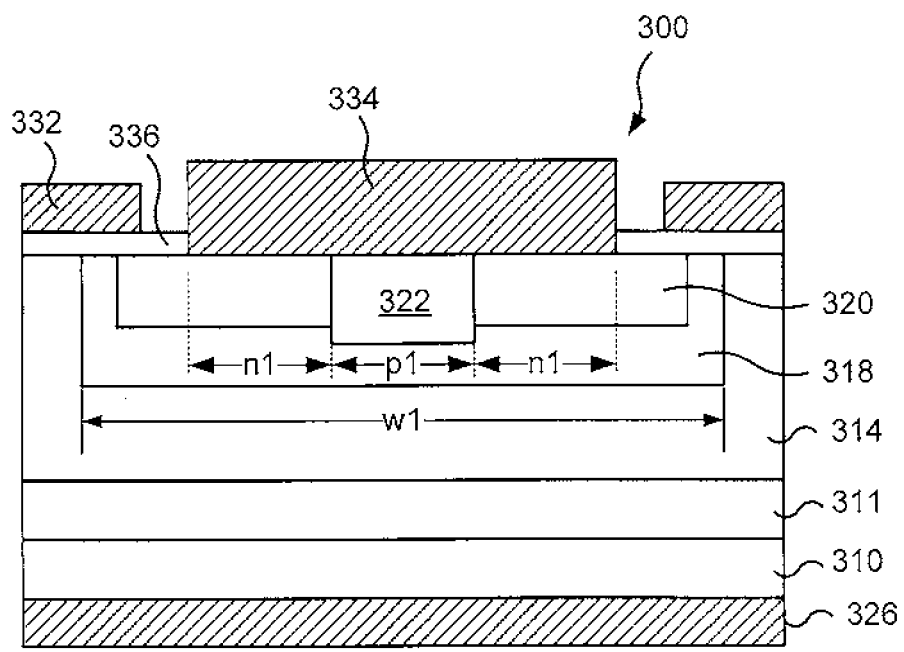
FIG. 26 is a cross sectional illustration of cell of a p-type insulated gate bipolar transistor device according to some embodiments.

A p-type insulated gate bipolar transistor (p-IGBT) device 300 according to some embodiments is illustrated in FIG. 26. As shown therein, the IGBT device includes a p− drift epitaxial layer 314 on a p-type field stop buffer layer 311 formed on an n-type, 8° off-axis 4H-SiC substrate 310. The p− drift layer 314 may have a thickness of about 100 μm to about 200 μm, and may be doped with p-type dopants at a doping concentration of about $2 \times 10^{14}$ cm$^{-3}$ to about $6 \times 10^{14}$ cm$^{-3}$.

The p-IGBT structure 300 further includes an n+ well region 318 and a p+ source/emitter region 320 that may be formed by selective implantation of, for example, nitrogen and aluminum, respectively. The junction depth of the n+ well region 318 may be about 0.5 μm. The structure 300 further includes a plurality of n+ body contact regions 322 that extend from a surface of the drift layer 314 into the n+ well region 318.

A gate contact 332 is on a gate insulator 336, a source/emitter contact 334 is on the source contact regions 320 and the body contact regions 322. A collector contact 326 contacts the substrate 310.

A 4H-SiC p-IGBT as shown in FIG. 26 was fabricated using a $2 \times 10^{14}$ cm$^{-3}$ doped, 140 μm thick p-type epilayer as the drift layer 314, and a 2 μm thick p-type Field-Stop buffer layer 311, with a doping concentration ranging from $1 \times 10^{17}$ cm$^{-3}$ to $5 \times 10^{17}$ cm$^{-3}$. A multi-zone JTE (15 zone) edge termination structure (not shown) was formed by nitrogen ion implantation. JTE terminations are described, for example, in U.S. Pat. No. 6,002,159, which is incorporated herein by reference. MOS channels were formed on implanted n-wells 318. A 50 nm thick thermally grown oxide layer was used as the gate insulator 336.

Figure 27:
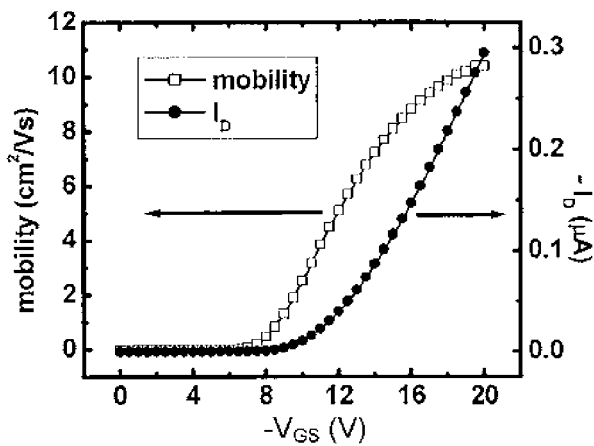
FIG. 27 is a graph showing current-voltage characteristics of the P-IGBT device of FIG. 26.

FIG. 27 shows the $I_D$-$V_{GS}$ characteristics of the p-IGBT device shown in FIG. 26, with $V_{DS}$ fixed at −50 mV. The $I_D$-$V_{GS}$ characteristics were measured from a test MOSFET with a W/L of 200 μm/200 μm, fabricated on the same wafer. A threshold voltage of −10 V, and a peak MOS channel mobility of 10 cm$^2$/Vs were extracted from the $I_D$-$V_{GS}$ characteristics.

Figure 28:
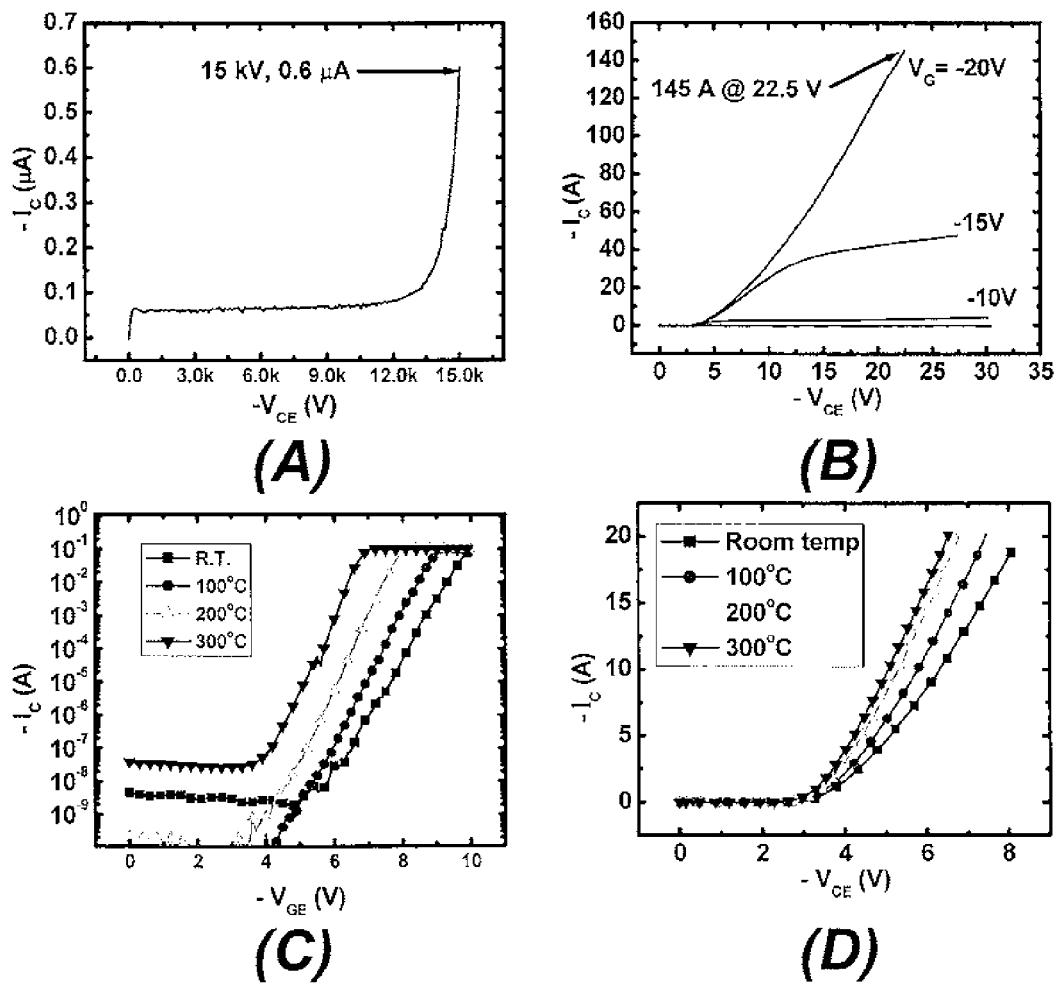
FIG. 28A is a graph showing voltage blocking characteristics of the p-IGBT of FIG. 26.
FIG. 28B is a graph showing pulsed on-state current-voltage characteristics of the P-IGBT of FIG. 26.
FIG. 28C is a graph showing further on-state current-voltage characteristics of the P-IGBTs of FIG. 26 for temperatures ranging from room temperature to 300° C.
FIG. 28D is a graph showing on-state current-voltage characteristics of the P-IGBTs of FIG. 26 as a function of temperature.

FIG. 28A shows the blocking characteristics ($V_{GE}$=0 V) of a 6.7 mm×6.7 mm 4H-SiC P-IGBT, with an active area of 0.16 cm$^2$ at room temperature. The measurement voltage was limited to −15 kV, due to the limitation of probing equipment. The device showed a leakage current of 0.6 μA, which corresponds to a leakage current density of 1.2 μA/cm$^2$ at a $V_{CE}$ of −15 kV. This is the highest blocking voltage ever reported in SiC power switches. FIG. 28B shows the pulsed on-state I-V characteristics of the p-IGBT, measured using a Tektronix 371 curve tracer. The device showed an on-state current of −145 A, which represents a current density of 906 A/cm$^2$, at a $V_{CE}$ of −22.5 V and a $V_{GE}$ of −20 V. No evidence of parasitic thyristor latch-up was observed during this measurement. FIG. 28C shows $I_c$-$V_{GE}$ characteristics of the 4H-SiC P-IGBTs for temperatures ranging from room temperature to 300° C. $V_{CE}$ was fixed at −10V for this measurement. The I-V characteristics shifted towards zero at elevated temperature. However, the device maintained normally-off properties throughout the temperature range. FIG. 28D shows the on-state I-V characteristics as a function of temperature. $V_{GE}$ was fixed at −20 V for this measurement. A monotonic decrease in forward voltage drop with increasing temperature was observed. This is believed due to the increase in minority carrier (electron) diffusion length, caused by increased carrier lifetime at elevated temperatures.

Accordingly, a p-IGBT according to some embodiments may have a reverse blocking voltage that is greater than about 10 kV, and in some cases greater than about 13 kV, and that has a forward current capability greater than 5 Amps.

It will be appreciated that although some embodiments of the disclosure have been described in connection with silicon carbide IGBT and MOSFET devices having n-type drift layers, the present disclosure is not limited thereto, and may be embodied in devices having p-type substrates and/or drift layers. Furthermore, the disclosure may be used in many different types of devices, including but not limited to insulated gate bipolar transistors (IGBTs), MOS controlled thyristors (MCTs), insulated gate commutated thyristors (IGCTs), junction field effect transistors (JFETs), high electron mobility transistors (HEMTs), etc.

In the drawings and specification, there have been disclosed typical embodiments of the disclosure and, although specific terms are employed, they are used in a generic and descriptive sense only and not for purposes of limitation, the scope of the disclosure being set forth in the following claims.

What is claimed is:
1. A power module comprising:
a housing with an interior chamber; and
a plurality of switch modules mounted within the interior chamber and interconnected to facilitate switching power to a load wherein each of the plurality of switch modules comprises at least one transistor configured to receive a separate control signal that is varied to provide a sinusoidal drive current and at least one diode wherein a source of the at least one transistor and an anode of the at least one diode are directly coupled together and directly coupled to a pin and the power module is able to block 1200 volts, conduct at least 50 amperes, and has switching losses of less than ten milli-Joules.
2. The power module of claim 1, wherein both the at least one transistor and the at least one diode are majority carrier devices.
3. The power module of claim 1 wherein the at least one transistor and the at least one diode are formed from a wide bandgap material system.
4. The power module of claim 3 wherein the wide bandgap material system is silicon carbide.
5. The power module of claim 3 wherein the wide bandgap material system is gallium nitride.
6. The power module of claim 3 wherein the at least one transistor is a MOSFET and the at least one diode is a Schottky diode.
7. The power module of claim 6 wherein the Schottky diode is a junction barrier Schottky diode.
8. The power module of claim 1 wherein the at least one transistor is coupled in anti-parallel with the at least one diode.
9. The power module of claim 8 wherein the at least one transistor comprises an array of transistors effectively coupled in parallel and the at least one diode comprises an array of diodes effectively coupled in parallel.

10. The power module of claim 2 wherein the power module is able to block at least 550 volts and operate at a switching frequency of at least 125 kHz.

11. The power module of claim 2 wherein the power module is able to block at least 1200 volts, conduct at least 50 amperes, and operate at a switching frequency of at least 75 kHz.

12. The power module of claim 2 wherein the power module has a power density of at least 400 watts/cm$^2$.

13. The power module of claim 2 wherein the power module has a power density of at least 425 watts/cm$^2$.

14. The power module of claim 2 wherein the power module has a power density of at least 500 watts/cm$^2$.

15. The power module of claim 2 wherein the at least one transistor is formed over an aluminum nitride substrate.

16. The power module of claim 2 wherein the plurality of switch modules are mounted to a copper base plate and the at least one transistor is formed over an aluminum nitride substrate.

17. The power module of claim 2 wherein the plurality of switch modules are mounted to an aluminum silicon carbide base plate and the at least one transistor is formed over an aluminum nitride substrate.

18. The power module of claim 2 wherein:
the plurality of switch modules consists of six switch modules;
a first and second of the switch modules are connected in series between a first bus and a second bus to form a first shunt leg;
a third and fourth of the switch modules are connected in series between the first bus and the second bus to form a second shunt leg; and
a fifth and sixth of the switch modules are connected in series between the first bus and the second bus to form a third shunt leg.

19. The power module of claim 18 wherein the at least one transistor is a SiC MOSFET and the at least one diode is a SiC Schottky diode.

20. The power module of claim 19 wherein the SiC Schottky diode is a junction barrier diode.

21. The power module of claim 19 wherein the at least one transistor is coupled in anti-parallel with the at least one diode.

22. The power module of claim 21 wherein the at least one transistor comprises an array of transistors effectively coupled in parallel and the at least one diode comprises an array of diodes effectively coupled in parallel.

23. The power module of claim 2 wherein the power module is able to block 1200 volts, conduct 50 amperes, and has switching losses of less than ten milli-Joules.

24. The power module of claim 2 wherein the power module is able to block at least 550 volts and operate at a switching frequency of at least 125 kHz.

25. The power module of claim 2 wherein the power module is able to block at least 1200 volts, conduct at least 50 amperes, and operate at a switching frequency of at least 75 kHz.

26. The power module of claim 19 wherein the power module has a power density of at least 400 watts/cm$^2$.

27. The power module of claim 19 wherein the power module has a power density of at least 425 watts/cm$^2$.

28. The power module of claim 19 wherein the power module has a power density of at least 500 watts/cm$^2$.

29. The power module of claim 19 wherein the at least one transistor is formed over an aluminum nitride substrate.

30. The power module of claim 1 wherein each of the plurality of switch modules forms a portion of a full H-bridge or a half H-bridge.

31. The power module of claim 1, wherein both the at least one transistor and the at least one diode are formed from a wide bandgap material system.

32. The power module of claim 31 wherein the wide bandgap material system is silicon carbide.

33. The power module of claim 31 wherein the wide bandgap material system is gallium nitride.

34. The power module of claim 31 wherein the at least one transistor is a MOSFET and the at least one diode is a Schottky diode.

35. The power module of claim 34 wherein the Schottky diode is a junction barrier Schottky diode.

36. The power module of claim 31 wherein the at least one transistor is coupled in anti-parallel with the at least one diode.

37. The power module of claim 36 wherein the at least one transistor comprises an array of transistors effectively coupled in parallel and the at least one diode comprises an array of diodes effectively coupled in parallel.

38. The power module of claim 31 wherein the power module is able to block at least 550 volts and operate at a switching frequency of at least 125 kHz.

39. The power module of claim 31 wherein the power module is able to block at least 1200 volts, conduct at least 50 amperes, and operate at a switching frequency of at least 75 kHz.

40. The power module of claim 31 wherein the power module has a power density of at least 400 watts/cm$^2$.

41. The power module of claim 31 wherein the power module has a power density of at least 425 watts/cm$^2$.

42. The power module of claim 31 wherein the power module has a power density of at least 500 watts/cm$^2$.

43. The power module of claim 31 wherein the at least one transistor is formed over an aluminum nitride substrate.

44. The power module of claim 31 wherein the plurality of switch modules are mounted to a copper base plate and the at least one transistor is formed over an aluminum nitride substrate.

45. The power module of claim 31 wherein the plurality of switch modules are mounted to an aluminum silicon carbide base plate and the at least one transistor is formed over an aluminum nitride substrate.

46. The power module of claim 31 wherein:
the plurality of switch modules consists of six switch modules;
a first and second of the switch modules are connected in series between a first bus and a second bus to form a first shunt leg;
a third and fourth of the switch modules are connected in series between the first bus and the second bus to form a second shunt leg; and
a fifth and sixth of the switch modules are connected in series between the first bus and the second bus to form a third shunt leg.

47. The power module of claim 46 wherein the at least one transistor is a SiC MOSFET and the at least one diode is a SiC Schottky diode.

48. The power module of claim 47 wherein the SiC Schottky diode is a junction barrier diode.

* * * * *